(12) United States Patent
Choi et al.

(10) Patent No.: US 10,690,703 B2
(45) Date of Patent: Jun. 23, 2020

(54) SEMICONDUCTOR DEVICE FOR MONITORING A REVERSE VOLTAGE

(71) Applicant: SAMSUNG ELECTRONICS CO., LTD., Suwon-si (KR)

(72) Inventors: Jun-han Choi, Daejeon (KR); Tae-hwang Kong, Suwon-si (KR); Kwang-ho Kim, Yongin-si (KR); Sang-ho Kim, Suwon-si (KR); Se-ki Kim, Suwon-si (KR); Jun-hyeok Yang, Seongnam-si (KR); Sung-yong Lee, Suwon-si (KR); Yong-jin Lee, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 15/868,172

(22) Filed: Jan. 11, 2018

(65) Prior Publication Data

US 2018/0231590 A1   Aug. 16, 2018

(30) Foreign Application Priority Data

Feb. 13, 2017   (KR) .................. 10-2017-0019567

(51) Int. Cl.

| G01R 19/14 | (2006.01) |
|---|---|
| H02J 7/02 | (2016.01) |
| G05F 1/46 | (2006.01) |
| H02J 50/10 | (2016.01) |
| H02J 50/80 | (2016.01) |
| H02J 7/00 | (2006.01) |

(52) U.S. Cl.
CPC ............. *G01R 19/14* (2013.01); *G05F 1/461* (2013.01); *H02J 7/00* (2013.01); *H02J 7/0068* (2013.01); *H02J 7/025* (2013.01); *H02J 50/10* (2016.02); *H02J 50/80* (2016.02); *H02J 7/00034* (2020.01)

(58) Field of Classification Search
CPC ...................................................... G01R 19/14
See application file for complete search history.

(56) References Cited

U.S. PATENT DOCUMENTS

| 4,631,628 | A | * | 12/1986 | Kissel ..................... | F02D 41/20 123/490 |
| 4,631,652 | A | * | 12/1986 | Wendt ..................... | H01F 27/38 348/E5.127 |
| 4,916,374 | A | * | 4/1990 | Schierbeek ........... | B60S 1/0818 250/341.3 |

(Continued)

FOREIGN PATENT DOCUMENTS

| JP | 2008-178194 A | 7/2008 |
| JP | 2015-90587 A | 5/2015 |
| KR | 10-1212736 B1 | 12/2012 |

*Primary Examiner* — Adam D Houston
(74) *Attorney, Agent, or Firm* — Sughrue Mion, PLLC

(57) ABSTRACT

A semiconductor device for monitoring a reverse voltage is provided. The semiconductor device includes an intellectual property having an input node and an output node; a passive component connected between the output node and a potential; a monitoring circuit connected to the input node and the output node and powered by a driving power, the monitoring circuit monitoring a difference between an input level at the input node and an output level at the output node to detect a reverse voltage across the intellectual property. The driving power is provided by the output node.

20 Claims, 21 Drawing Sheets

(56) References Cited

U.S. PATENT DOCUMENTS

| | | | | |
|---|---|---|---|---|
| 4,967,302 A * | 10/1990 | Hutcheon | G08C 19/02 | 307/326 |
| 5,107,190 A * | 4/1992 | Schultz | H02M 3/156 | 315/387 |
| 6,275,023 B1 * | 8/2001 | Oosaki | G01R 31/31924 | 324/756.06 |
| 6,301,133 B1 * | 10/2001 | Cuadra | H02J 1/102 | 363/65 |
| 6,639,815 B1 * | 10/2003 | Gucyski | H02M 1/088 | 363/40 |
| 7,274,113 B2 | 9/2007 | Ebata | | |
| 7,528,582 B1 * | 5/2009 | Ferguson | H02J 7/045 | 320/164 |
| 7,816,977 B2 | 10/2010 | Shin | | |
| 7,826,122 B2 * | 11/2010 | Morishita | G02F 1/2255 | 359/239 |
| 9,098,100 B2 | 8/2015 | Endo et al. | | |
| 2002/0135235 A1 * | 9/2002 | Winick | H02J 1/102 | 307/87 |
| 2003/0039130 A1 * | 2/2003 | Curtiss | G05F 1/613 | 363/37 |
| 2004/0099788 A1 * | 5/2004 | Hedin | G01J 1/4257 | 250/205 |
| 2004/0257005 A1 * | 12/2004 | Poehlman | H05B 41/2855 | 315/291 |
| 2005/0248964 A1 * | 11/2005 | Dalal | H02M 3/33592 | 363/21.08 |
| 2006/0061346 A1 * | 3/2006 | Lee | G05F 1/465 | 323/313 |
| 2006/0094457 A1 * | 5/2006 | Song | H04W 52/0254 | 455/522 |
| 2006/0164057 A1 * | 7/2006 | Kudo | H02M 3/1588 | 323/282 |
| 2007/0085520 A1 * | 4/2007 | Ho | H02M 3/1588 | 323/282 |
| 2007/0115044 A1 * | 5/2007 | Chan | H02M 3/07 | 327/540 |
| 2008/0062730 A1 * | 3/2008 | Wirtzberger | H02J 1/102 | 363/50 |
| 2009/0085540 A1 | 4/2009 | Nishida | | |
| 2009/0096413 A1 * | 4/2009 | Partovi | H01F 5/003 | 320/108 |
| 2009/0278571 A1 * | 11/2009 | Pietri | G05F 3/205 | 327/50 |
| 2010/0164289 A1 * | 7/2010 | Umminger | H02J 1/10 | 307/55 |
| 2012/0049815 A1 * | 3/2012 | Veeramreddi | H02M 3/158 | 323/282 |
| 2012/0242372 A1 * | 9/2012 | Kollmann | H03K 17/302 | 327/77 |
| 2013/0107091 A1 * | 5/2013 | Teshima | H04N 5/365 | 348/300 |
| 2013/0176651 A1 * | 7/2013 | Burnham | H02H 1/003 | 361/56 |
| 2013/0188287 A1 | 7/2013 | Imura | | |
| 2013/0235620 A1 * | 9/2013 | Morris | H02M 3/335 | 363/21.12 |
| 2014/0085759 A1 | 3/2014 | Richter | | |
| 2014/0097790 A1 * | 4/2014 | Yeh | H02J 7/0063 | 320/108 |
| 2015/0048795 A1 * | 2/2015 | Hashimoto | H02J 7/00 | 320/126 |
| 2015/0084431 A1 * | 3/2015 | Yeh | H02J 7/0044 | 307/104 |
| 2015/0223305 A1 * | 8/2015 | Yang | H05B 45/37 | 315/193 |
| 2015/0249380 A1 * | 9/2015 | Hayakawa | H02M 3/33523 | 363/21.16 |
| 2015/0263623 A1 | 9/2015 | Shiina et al. | | |
| 2015/0306968 A1 * | 10/2015 | Ohira | H02J 7/0027 | 307/24 |
| 2015/0326102 A1 * | 11/2015 | Radhakrishnan | H02M 1/00 | 323/271 |
| 2015/0340880 A1 * | 11/2015 | Kdoshim | H02J 5/005 | 307/104 |
| 2016/0056639 A1 * | 2/2016 | Mao | H02J 50/80 | 307/104 |
| 2016/0092393 A1 * | 3/2016 | Nge | G06F 13/382 | 710/14 |
| 2016/0103459 A1 * | 4/2016 | Chern | G05F 1/468 | 323/313 |
| 2016/0154415 A1 * | 6/2016 | B z itu | G05F 1/575 | 323/280 |
| 2016/0241015 A1 | 8/2016 | Gofman | | |
| 2016/0299555 A1 * | 10/2016 | Rucker | H05B 47/185 | |
| 2017/0012193 A1 * | 1/2017 | Jogia | H02J 50/05 | |
| 2017/0038736 A1 * | 2/2017 | Kawaguchi | H02P 8/02 | |
| 2017/0047902 A1 * | 2/2017 | Wei | H02M 3/155 | |
| 2017/0085256 A1 * | 3/2017 | Nomiyama | H03K 17/0822 | |
| 2017/0087997 A1 * | 3/2017 | Trunk | H02H 7/1255 | |
| 2017/0185733 A1 * | 6/2017 | Nogueira | G06N 3/126 | |
| 2017/0310121 A1 * | 10/2017 | Gong | H02J 7/00 | |
| 2017/0310259 A1 * | 10/2017 | Chassard | H02J 7/1492 | |
| 2017/0346284 A1 * | 11/2017 | Lee | G06F 1/26 | |
| 2018/0007758 A1 * | 1/2018 | Rucker | H05B 45/10 | |
| 2018/0026538 A1 * | 1/2018 | Dalena | H02M 3/158 | 323/271 |
| 2018/0062509 A1 * | 3/2018 | Duong | H02M 1/08 | |
| 2018/0088157 A1 * | 3/2018 | Cocchini | G01R 19/0053 | |
| 2018/0090944 A1 * | 3/2018 | Reddiconto | H02J 2207/20 | |
| 2018/0145242 A1 * | 5/2018 | Tamayama | G05F 1/46 | |
| 2018/0172758 A1 * | 6/2018 | Kashima | G01R 19/16566 | |
| 2018/0231590 A1 * | 8/2018 | Choi | H02J 50/80 | |
| 2018/0254644 A1 * | 9/2018 | Cho | H02J 7/0029 | |
| 2018/0348075 A1 * | 12/2018 | Rubinstein | F17C 1/00 | |
| 2018/0351449 A1 * | 12/2018 | Hattori | H02M 1/32 | |
| 2019/0037660 A1 * | 1/2019 | Rucker | H05B 47/16 | |
| 2019/0055835 A1 * | 2/2019 | Brookes | E21B 47/042 | |
| 2019/0056132 A1 * | 2/2019 | Warren | F24F 11/30 | |
| 2019/0056444 A1 * | 2/2019 | Dragoi | G01R 31/50 | |
| 2019/0067984 A1 * | 2/2019 | Heubi | H02M 3/157 | |
| 2019/0074145 A1 * | 3/2019 | Delacruz | G01R 15/202 | |
| 2019/0081485 A1 * | 3/2019 | Kim | H02J 7/342 | |
| 2019/0128930 A1 * | 5/2019 | Tran | G01R 33/02 | |
| 2019/0157044 A1 * | 5/2019 | Ziemba | H03K 3/021 | |
| 2019/0214911 A1 * | 7/2019 | Hashiguchi | B60R 16/033 | |
| 2019/0229641 A1 * | 7/2019 | Umehara | H02M 7/217 | |

* cited by examiner

FIG. 11A

| DRIVING POWER VOLTAGE | MODE | LEVEL OF DRIVING POWER VOLTAGE | OPERATING STATE |
|---|---|---|---|
| VDD | NORMAL MODE | Level H | NORMAL |
| | POWER DOWN MODE | Level H | NORMAL |
| | | Level L | ABNORMAL |

FIG. 11B

| DRIVING POWER VOLTAGE | MODE | EVENT | LEVEL OF DRIVING POWER VOLTAGE | OPERATING STATE |
|---|---|---|---|---|
| VREG | NORMAL MODE | REVERSE VOLTAGE OCCURS | LEVEL H | NORMAL |
| | NORMAL MODE | REVERSE VOLTAGE DOES NOT OCCUR | LEVEL H | NORMAL |
| | POWER DOWN MODE | REVERSE VOLTAGE OCCURS | LEVEL H | NORMAL |
| | POWER DOWN MODE | REVERSE VOLTAGE DOES NOT OCCUR | LEVEL L | NORMAL |

SEMICONDUCTOR DEVICE FOR MONITORING A REVERSE VOLTAGE

CROSS-REFERENCE TO RELATED APPLICATION

This application claims priority from Korean Patent Application No. 10-2017-0019567, filed on Feb. 13, 2017, in the Korean Intellectual Property Office, the disclosure of which is incorporated by reference herein in its entirety.

BACKGROUND

Apparatuses, devices, and articles of manufacture consistent with the present disclosure relate to a semiconductor device for monitoring a reverse voltage and reverse voltage-monitoring circuit, and more particularly, to semiconductor device including a reverse voltage-monitoring circuit for reducing power consumption.

A mobile device, such as a smart phone, a tablet personal computer (PC), or a wearable device, which are examples of an electronic device, may include various wireless modules for performing wireless charging or performing wireless communication with an external device. The various wireless modules may interfere with each other due to weight reduction and miniaturization of the electronic device. For example, a reverse voltage (or reverse current) generated by interference may cause the performance of the electronic device to deteriorate or may cause the product to be damaged.

In order to prevent such reverse voltage or reverse current damage, a reverse voltage-monitoring circuit may be employed in an electronic device. However, in this case, there are disadvantages in that power consumption increases because of the addition of the reverse voltage-monitoring circuit or the reverse voltage-monitoring circuit might not normally operate in a specific mode.

SUMMARY

It is an aspect to provide a semiconductor device capable of monitoring a reverse voltage while reducing power consumption while normally maintaining a reverse voltage-monitoring function.

According to an aspect of an exemplary embodiment, there is provided a semiconductor device comprising an intellectual property having an input node and an output node; a passive component connected between the output node and a potential; a monitoring circuit connected to the input node and the output node and powered by a driving power, the monitoring circuit configured to monitor a difference between an input level at the input node and an output level at the output node to detect a reverse voltage across the intellectual property, wherein the driving power is provided by the output node.

According to another aspect of an exemplary embodiment, there is provided a semiconductor device comprising a regulator that regulates a source power voltage to generate a regulated voltage at an output of the regulator; a passive component connected between a potential and the output of the regulator; and a comparator that is driven by a driving power, that performs a comparison of the source power voltage with the regulated voltage, and that generates a control signal based on the comparison, wherein the driving power is provided by the regulated voltage, and the control signal controls the regulator.

According to another aspect of an exemplary embodiment, there is provided a semiconductor device that operates in a normal mode and a power down mode, the semiconductor device comprising a regulator; a passive component connected between a potential and an output of the regulator; and a comparator that is driven by a driving power supplied by an output of the regulator, that performs a comparison of a source power voltage with the output of the regulator, and that generates a control signal that controls the regulator based on the comparison, wherein in the normal mode, the regulator regulates the source power voltage to output a regulated voltage at the output of the regulator, and in the power down mode, the regulator is operated by a second voltage that is lower than the first voltage.

According to another aspect of an exemplary embodiment, there is provided a semiconductor device that operates in a normal mode and a power down mode, the semiconductor device comprising an intellectual property having an input node and an output node; a passive component connected between the output node and a potential; a monitoring circuit connected to the input node and the output node and powered by a driving power provided by the output node, the monitoring circuit configured to monitor a difference between an input level at the input node and an output level at the output node and generate a control signal to control the intellectual property, wherein in the normal mode, the intellectual property is operated by a first voltage, and in the power down mode, the intellectual property is operated by a second voltage that is lower than the first voltage.

According to another aspect of an exemplary embodiment, there is provided a reverse voltage monitoring circuit comprising a driving power terminal; a first input terminal that receives a first voltage; a second input terminal that receives an second voltage that is lower than the first voltage; and an output terminal that outputs an output signal based on a comparison of the first input voltage and the second input voltage, the comparison performed using a driving power supplied through the driving power terminal, wherein the second input terminal is connected to the driving power terminal, and a passive component is connected between the second input terminal and a potential.

According to another aspect of an exemplary embodiment, there is provided a reverse voltage monitoring circuit comprising a first transistor having a gate, a source and a drain; a second transistor having a gate, a source, and a drain connected to the drain of the first transistor; a third transistor having a gate, a drain connected to the gate, and a source connected to the gate of the first transistor; a fourth transistor having a gate connected to the gate of the third transistor, a source connected to the source of the third transistor, and a drain connected to a source of the second transistor and to a potential through a passive component, wherein a first voltage is supplied to the gate of the first transistor, a second voltage is supplied to a gate of the second transistor.

BRIEF DESCRIPTION OF THE DRAWINGS

Exemplary embodiments will be more clearly understood from the following detailed description taken in conjunction with the accompanying drawings in which:

FIGS. 11A and 11B are tables showing an operation example when a power supply voltage is applied as a driving power voltage to a reverse voltage-monitoring circuit according to the related art, and an operation example when a regulating voltage is applied as a driving power voltage to a reverse voltage-monitoring circuit according to various exemplary embodiments, respectively;

DETAILED DESCRIPTION

Hereinafter, exemplary embodiments will be described in detail with reference to the accompanying drawings.

Figure 1:
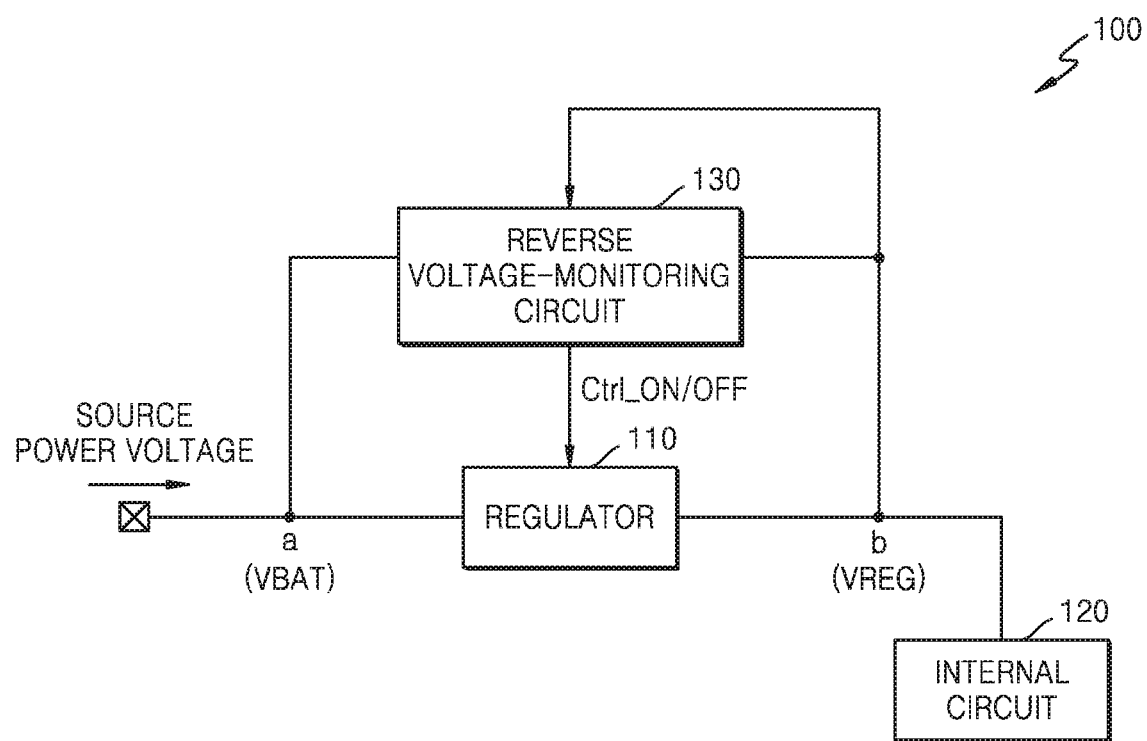
FIG. 1 is a block diagram of a semiconductor device according to an exemplary embodiment.

FIG. 1 is a block diagram of a semiconductor device 100 according to an exemplary embodiment.

The semiconductor device 100 shown in FIG. 1 may be a device that includes a semiconductor circuit and performs a specific function. According to some exemplary embodiments, the semiconductor device 100 may be a semiconductor chip mounted on a mobile device. Alternatively, the semiconductor device 100 may be mounted on a mobile device as a semiconductor package in which one or more semiconductor chips are packaged.

According to some exemplary embodiments, the semiconductor device 100 may be a semiconductor chip or package that performs voltage management, such as receiving a source power voltage VBAT supplied from the outside, processing the source power voltage VBAT to generate a power supply voltage, and providing the power supply voltage to an external device. As an example, the power supply voltage that is generated may be a regulating voltage VREG. Alternatively, the semiconductor device 100, which is a semiconductor chip or package that may be used for various purposes, may generate the power supply voltage and provide the power supply voltage to an internal circuit 120. The power supply voltage may be the regulating voltage VREG. In the description of exemplary embodiments of the inventive concept, it is assumed that the semiconductor device 100 is a semiconductor chip that provides the regulating voltage VREG to the internal circuit 120. However, as described above, the semiconductor device 100 may be applied to various types of semiconductor chips or semiconductor packages.

The semiconductor device 100 may include a regulator 110, the internal circuit 120, and a reverse voltage-monitoring circuit 130. The semiconductor device 100 may be coupled to an external source power voltage VBAT via one or more terminals. The semiconductor device 100 may directly receive power, provided from an external battery, as the source power voltage VBAT or may receive power, supplied from an external battery, as the source power voltage VBAT, through a power management integrated circuit (PMIC).

The regulator 110 may convert an unstable source power voltage VBAT provided from the outside to a stable power supply voltage (for example, a regulating voltage VREG) or may generate the stable power supply voltage (for example, the regulating voltage VREG) based on the unstable source power voltage VBAT, and may provide the generated regulating voltage VREG to the internal circuit 120. According to some exemplary embodiments, the level of the regulating voltage VREG may be lower than the source power voltage VBAT. The regulator 110 may include an input terminal and an output terminal, the input terminal may be connected to a first node a to which the source power voltage VBAT is applied, and the output terminal may be connected to a second node b to which the regulating voltage VREG is output.

A reverse voltage may occur between the input terminal and the output terminal of the regulator 110 due to factors occurring inside or outside the semiconductor device 100, and thus, a reverse current may flow from the second node b to the first node a. For example, assuming that the internal circuit 120 includes a configuration capable of generating mutual induction, mutual induction may occur between a device (for example, a device that performs wireless charging or wireless communication) outside the semiconductor device 100 and the internal circuit 120 in the semiconductor device 100, and thus, the voltage level of the second node b may rise due to the mutual induction. In this case, the above-described reverse voltage (or reverse current) phenomenon may occur when the level of the regulating voltage VREG of the second node b becomes higher than the level of the source power voltage VBAT. When the reverse voltage phenomenon occurs, a reverse current may flow into an external device through the first node a, and the external device such as a battery may be damaged by the reverse current.

The reverse voltage-monitoring circuit 130 may be connected to the input terminal and the output terminal of the regulator 110 and generate a control signal Ctrl_ON/OFF for controlling the operation of the regulator 110 according to a result of comparing the voltages of the input terminal and the output terminal of the regulator. As an example, the reverse voltage-monitoring circuit 130 may include a comparator (not shown in FIG. 1), and the comparator may receive the source power voltage VBAT applied to the first node a and the regulating voltage VREG applied to the second node b, as input signals. The reverse voltage-monitoring circuit 130 may receive a driving power voltage to perform a comparison function, and driving capability for the comparison operation may increase or decrease according to the level of the driving power voltage.

According to some exemplary embodiments, the reverse voltage-monitoring circuit 130 may output a first control signal Ctrl_ON for normally operating the regulator 110 when the level of the source power voltage VBAT is greater than the level of the regulating voltage VREG. On the other hand, when the level of the source power voltage VBAT is less than the level of the regulating voltage VREG, the reverse voltage-monitoring circuit 130 may interrupt the operation of the regulator 110 and output a second control signal Ctrl_OFF for preventing transfer of a reverse current to the first node a of the regulator 110. That is, when the reverse voltage occurs across the regulator 110 (i.e., when VREG is greater than VBAT), the regulator 110 becomes open, which is an example of a "shut off" state. This shut off state may be temporary, or the regulator 110 may remain in the shut off state until completely reset.

In some cases, the reverse voltage-monitoring circuit 130 may use a voltage having a varying level as the driving power voltage, rather than a power supply voltage having a fixed level. According to some exemplary embodiments, the reverse voltage-monitoring circuit 130 may use a voltage, which has a level varying in a certain mode, as a driving power voltage. For example, the certain mode may be a power down mode or a standby mode. In the description that follows, the certain mode is assumed to be a power down mode. As an example, the reverse voltage-monitoring circuit 130 may use the regulating voltage VREG, which is an output voltage of the regulator 110, as a driving power voltage. That is, the reverse voltage-monitoring circuit 130 may receive the regulating voltage VREG as a driving power voltage for driving the comparator, in addition to receiving the regulating voltage VREG as one input signal for the comparison operation.

The semiconductor device 100 or a system employing the semiconductor device 100 may operate in a power down mode. In the power down mode, the semiconductor device 100 or the system needs to minimize power consumption (or current consumption) while normally maintaining a monitoring operation performed by the reverse voltage-monitoring circuit 130 as in a normal mode. According to various exemplary embodiments of the inventive concept, the reverse voltage-monitoring circuit 130 may normally perform a reverse voltage-monitoring operation in the power down mode and minimize power consumed in the power down mode, by using a voltage having a varying level as a driving power voltage.

For example, in the power down mode, the regulating voltage VREG output from the regulator 110 has a very small value (for example, the value may be substantially 0V but the nominal voltage Vth depends on the system). In a normal, forward voltage, state in which a reverse voltage situation does not occur, the reverse voltage-monitoring circuit 130 may maintain the output of the first control signal Ctrl_ON for maintaining the operating state of the regulator 110. For example, in a normal, forward voltage, state in some implementations, VBAT may be about 5V and VREG may be about 3.5V. Also, in the power down mode, the reverse voltage-monitoring circuit 130 may receive the regulating voltage VREG having a very small value as the driving power voltage, so that power consumption by the reverse voltage-monitoring circuit 130 may be minimized.

When a reverse voltage situation occurs due to a factor generated inside or outside the semiconductor device 100 in the power down mode, the level of the regulating voltage VREG may increase due to the reverse voltage situation. Accordingly, the reverse voltage-monitoring circuit 130 may be driven by a driving power voltage having a relatively high level and may output the second control signal Ctrl_OFF as a result of detecting the reverse voltage situation. The regulator 110 may stop a regulating operation in response to the second control signal Ctrl_OFF, thereby preventing flow of a reverse current into an external device.

In the above operation example, the reverse voltage-monitoring circuit 130 may be driven by a driving power voltage having a very small voltage level when a reverse voltage situation does not occur in the power down mode, and thus, the driving capability of the comparator may be lowered and the output of the control signal Ctrl_ON may be unstable. According to some exemplary embodiments of the inventive concept, the reverse voltage-monitoring circuit 130 may further include a configuration for maintaining the level of the output terminal of the comparator to a specific voltage level. For example, the reverse voltage monitoring circuit 130 may include a configuration for pulling up or pulling down the level of the output terminal of the comparator. This configuration will be described in detail below.

According to the semiconductor device 100 according to the exemplary embodiments, a separate power supply voltage for driving the reverse voltage-monitoring circuit 130 is not used. Also, even if a battery is removed from the system in which the semiconductor device 100 is employed, the reverse voltage-monitoring circuit 130 may monitor a reverse voltage situation. In addition, a reverse voltage situation may be monitored even in a mode requiring only minimal power/current consumption, such as a power down mode or a standby mode.

Although FIG. 1 illustrates an example in which the reverse voltage-monitoring circuit 130 monitors the input and output terminals of the regulator 110, the inventive concept is not limited thereto. For example, the semiconductor device 100 may include various types of intellectual properties (IPs), and at least some of the IPs may have an input terminal voltage and an output terminal voltage, which are different in level. That is, the reverse voltage-monitoring circuit 130 may perform monitoring on various other types of IPs for which reverse voltage monitoring is available in the semiconductor device 100. For example, the reverse voltage-monitoring circuit 130 may also perform a reverse voltage-monitoring operation by using the voltages of input and output terminals of an IP provided in the internal circuit 120.

The semiconductor device 100 may correspond to various modules related to a wireless operation. For example, the semiconductor device 100 may correspond to a near field communication (NFC) module or a wireless charging module. Assuming that the semiconductor device 100 is an NFC module, the semiconductor device 100 may be coupled to an NFC coil, and the internal circuit 120 may include various configurations related to NFC communication, for example, a configuration for processing a voltage from the NFC coil to generate data, a configuration for processing generated data, and the like. As an example, the level of the voltage of the second node b may rise due to electromagnetic wave energy flowing into the NFC coil.

Figure 2:
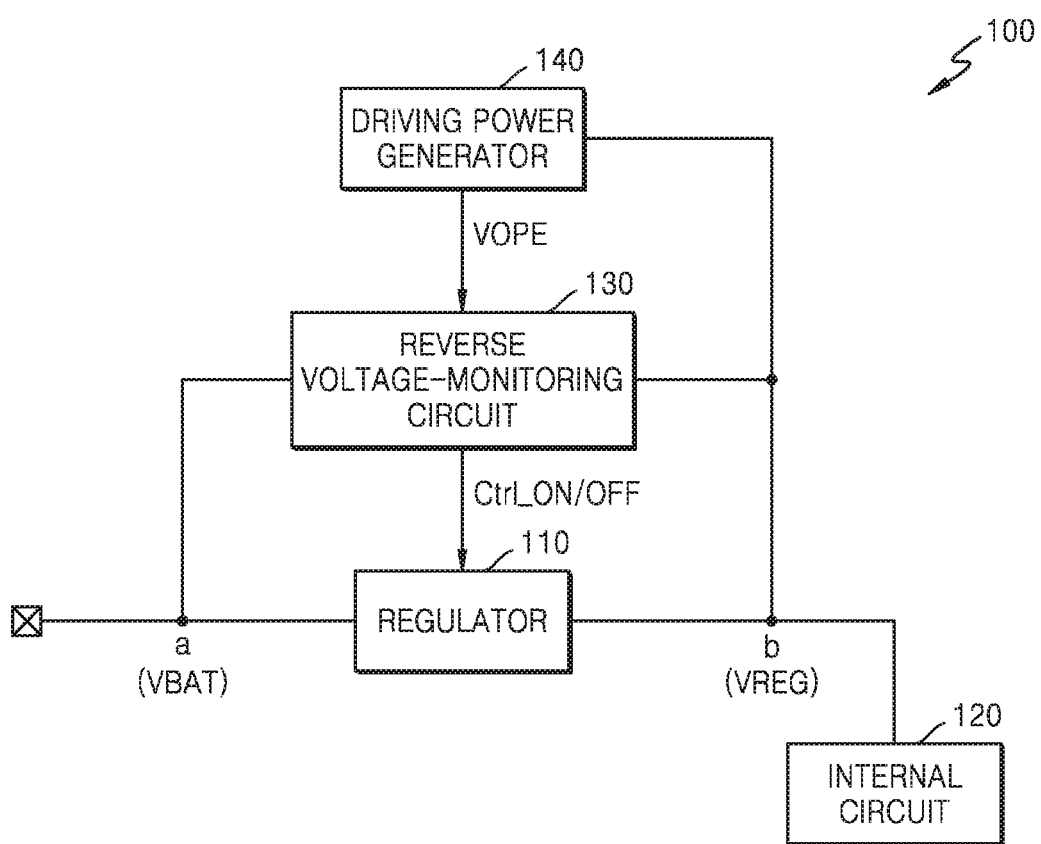
FIG. 2 is a block diagram of a semiconductor device according to a modified exemplary embodiment.

FIG. 2 is a block diagram of a semiconductor device 100 according to a modified exemplary embodiment. The operation of components shown in FIG. 2 which are the same as the components shown in FIG. 1 is substantially the same as the operation of the components shown in FIG. 1, and thus, components having substantially the same operation will not be described again in detail for conciseness.

Referring to FIG. 2, the semiconductor device 100 may include a regulator 110, an internal circuit 120, and a reverse voltage-monitoring circuit 130, and may further include a driving power generator 140. The reverse voltage-monitoring circuit 130 may compare the voltage level of an input terminal of the regulator 110 to the voltage level of an output terminal of the regulator 110. For example, a comparator (not shown in FIG. 2) in the reverse voltage-monitoring circuit 130 may receive a source power voltage VBAT applied to a first node a and a regulating voltage VREG applied to a second node b, as two input signals.

In addition, similar to the above-described exemplary embodiment of FIG. 1, the reverse voltage-monitoring circuit 130 may receive a driving power voltage VOPE of which the level varies according to an operation mode. As an example, the driving power generator 140 may receive the regulating voltage VREG and generate a driving power voltage VOPE, which has a level suitable for driving the reverse voltage-monitoring circuit 130, through a voltage regulating operation on the regulating voltage VREG. The driving power generator 140 may generate the driving power voltage VOPE based on the regulating voltage VREG, and thus, the level of the driving power voltage VOPE may decrease when the level of the regulating voltage VREG decreases, whereas the level of the driving power voltage VOPE may increase when the level of the regulating voltage VREG increases.

According to some exemplary embodiments, the level of the driving power voltage VOPE may vary in various ways depending on the operation mode of the semiconductor device 100. For example, in a normal mode, power consumption by the reverse voltage-monitoring circuit 130 may be allowed, and thus, the driving power generator 140 may amplify the level of the regulating voltage VREG in the normal mode to generate a driving power voltage VOPE, and may provide the generated driving power voltage VOPE to the reverse voltage-monitoring circuit 130. The reverse voltage-monitoring circuit 130 may operate in the normal mode according to the driving power voltage VOPE having a sufficient voltage level.

On the other hand, in a power down mode where power consumption is not allowed or only very low power consumption is allowed, the drive power generator 140 may generate a driving power voltage VOPE without amplifying the regulating voltage VREG or by amplifying the regulating voltage VREG at a low amplification ratio and provide the generated driving power voltage VOPE to the reverse voltage-monitoring circuit 130. Accordingly, power consumed by the reverse voltage-monitoring circuit 130 in the power down mode may be minimized.

Figure 3:
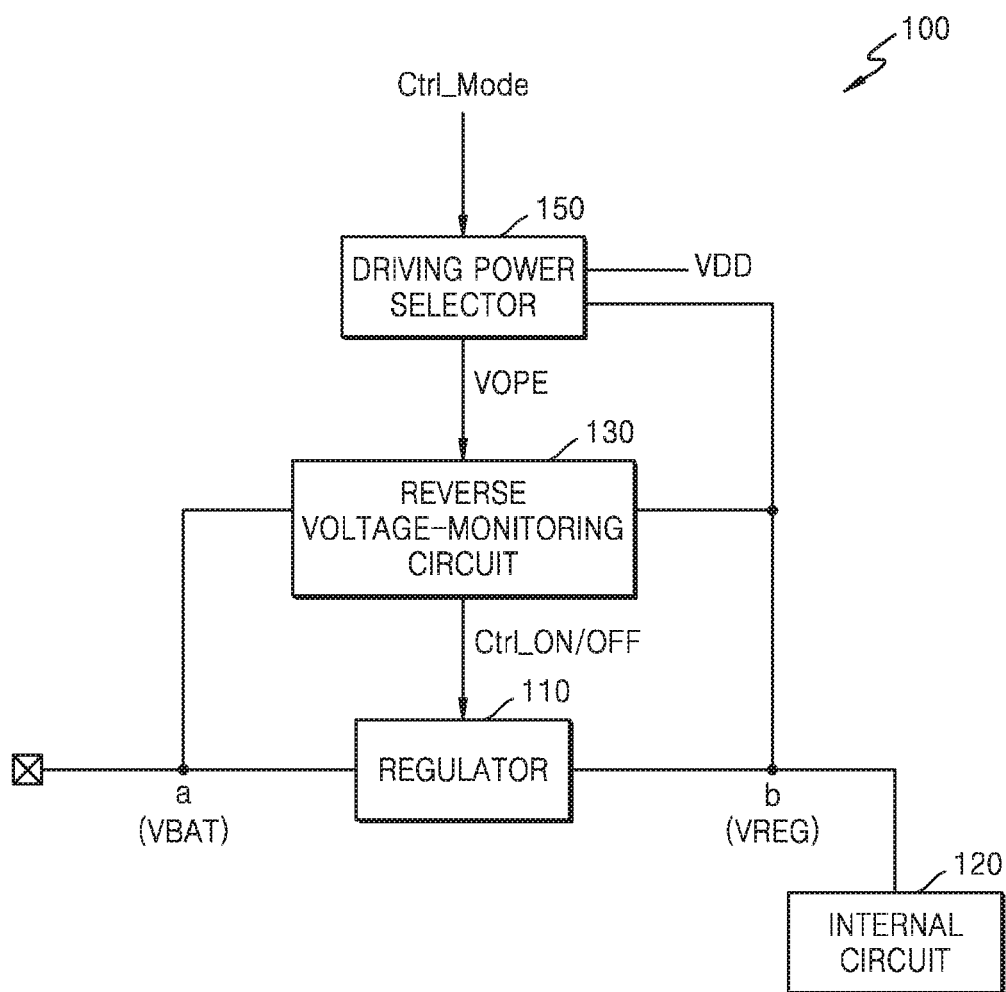
FIG. 3 is a block diagram of a semiconductor device according to another modified exemplary embodiment.

FIG. 3 is a block diagram of a semiconductor device 100 according to another modified exemplary embodiment. The operation of components shown in FIG. 3 which is the same as the components shown in FIG. 1 or 2 is substantially the same as the operation of the components shown in FIG. 1 or 2, and thus, components having substantially the same operation will not be described in detail again for conciseness.

Referring to FIG. 3, the semiconductor device 100 may include a regulator 110, an internal circuit 120, and a reverse voltage-monitoring circuit 130, and may further include a driving power selector 150. The reverse voltage-monitoring circuit 130 may receive a source power voltage VBAT applied to a first node a and a regulating voltage VREG applied to a second node b, as two input signals.

Similar to the above-described exemplary embodiment shown in FIG. 2, the reverse voltage-monitoring circuit 130 may receive a driving power voltage VOPE of which the level varies according to an operation mode. As an example, the driving power selector 150 may receive a power supply voltage VDD having a constant level and a regulating voltage VREG varying in level according to the operation of the regulator 110, and may selectively provide the power supply voltage VDD or the regulating voltage VREG to the reverse voltage-monitoring circuit 130 as the driving power voltage VOPE. In some exemplary embodiments, VDD may be another regulated voltage supplied from outside the semiconductor device 100. According to some exemplary embodiments, the driving power selector 150 may select the power supply voltage VDD or the regulating voltage VREG in response to a mode control signal Ctrl_Mode. The mode control signal Ctrl_Mode may be generated outside the semiconductor device 100 and be provided to the driving power selector 150 or may be generated by the system, in which the semiconductor device 100 is employed, and transferred to the semiconductor device 100 and provided to the driving power selector 150.

In a normal mode, the driving power selector 150 may select the power supply voltage VDD and provide the power supply voltage VDD as the driving power voltage VOPE to the reverse voltage-monitoring circuit 130. The reverse voltage-monitoring circuit 130 may be driven by a power supply voltage VDD having a sufficient voltage level in the normal mode. In a power down mode, the driving power selector 150 may select the regulating voltage VREG and provide the regulating voltage VREG as the driving power VOPE to the reverse voltage-monitoring circuit 130. The reverse voltage-monitoring circuit 130 may minimize power consumption as the reverse voltage-monitoring circuit 130 is driven by a regulating voltage VREG having a decreased level in the power down mode. In addition, when a reverse voltage situation occurs in the power down mode, the reverse voltage-monitoring circuit 130 may output a control signal Ctrl_ON/OFF according to a reverse voltage-monitoring result as the reverse voltage-monitoring circuit 130 is driven by a regulating voltage VREG having an increased level as in the above-described exemplary embodiments.

Figure 4:
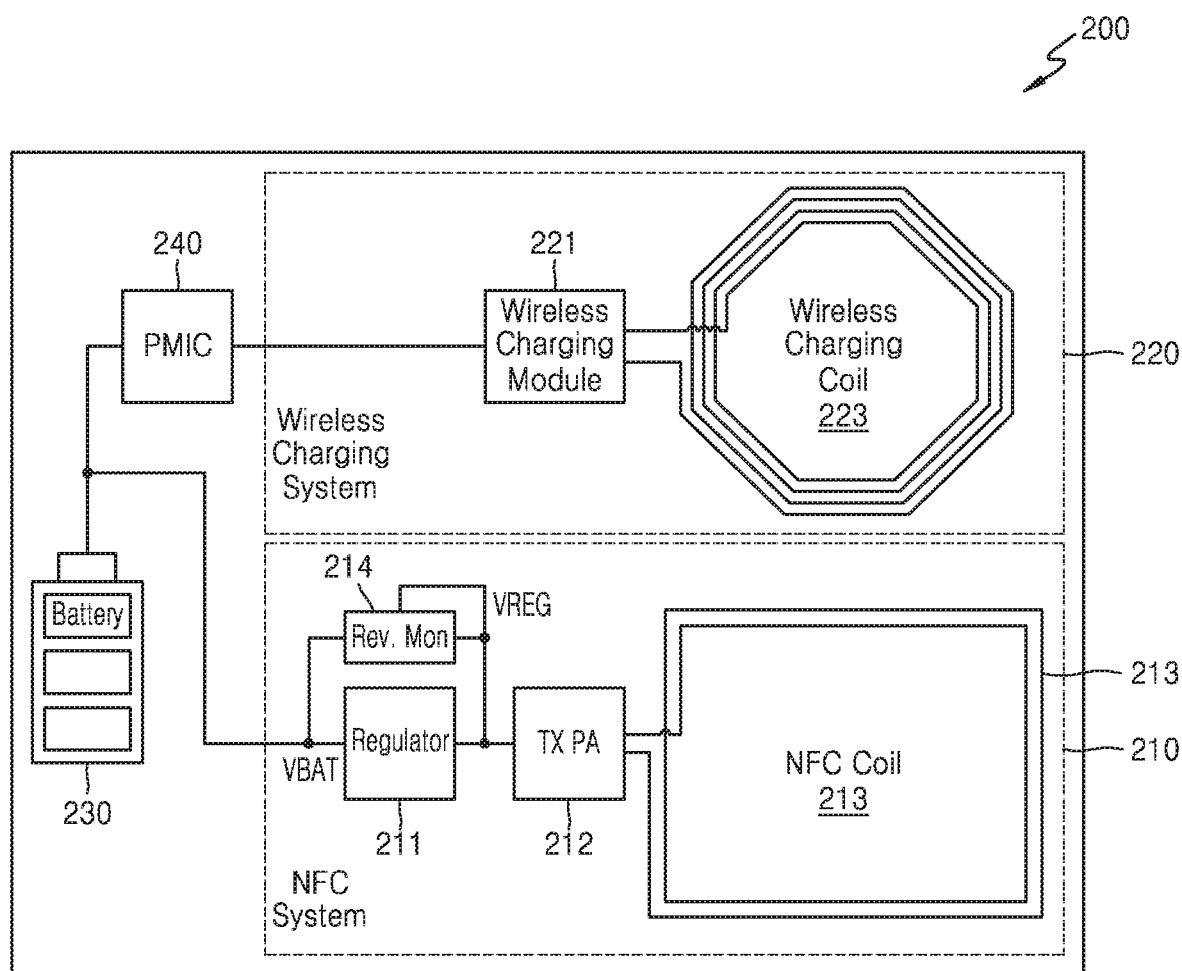
FIGS. 4 and 5 are block diagrams illustrating examples in which a semiconductor device according to an exemplary embodiment is employed in various kinds of user terminals.
Figure 5:
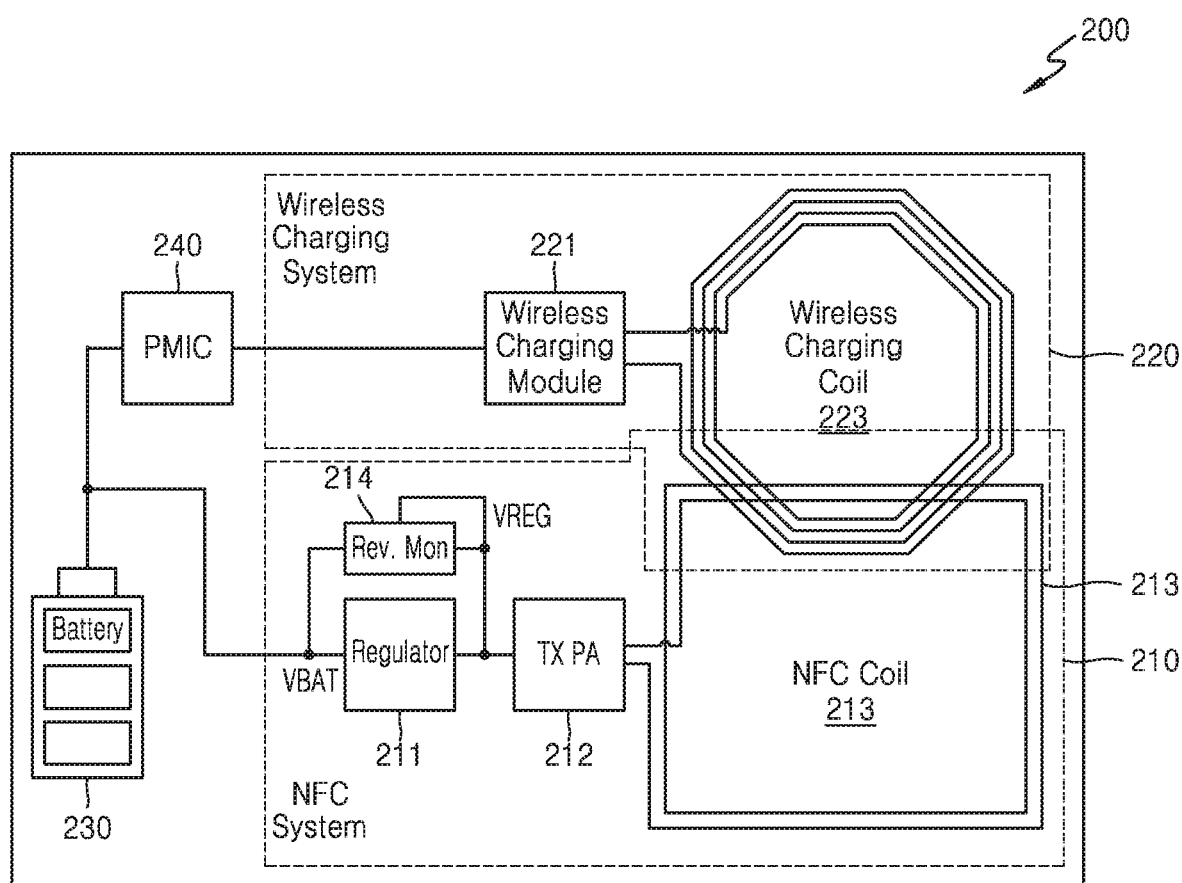

FIGS. 4 and 5 are block diagrams illustrating examples in which a semiconductor device according to exemplary embodiments of the inventive concept is employed in various kinds of user terminals. FIGS. 4 and 5 show examples in which the user terminal corresponds to a mobile device 200. In addition, FIGS. 4 and 5 show examples in which a system that performs a wireless communication function and a system that performs a wireless charging function are employed in the user terminal. However, the inventive concept is not limited thereto, and the semiconductor device according to the exemplary embodiments of the inventive concept may be applied to various systems requiring a reverse voltage monitoring function or a reverse current monitoring function.

The mobile device 200 may be any device that employs a charging coil and an near field communication (NFC) coil. For example, the mobile device 200 may be a smart phone, a cellular phone, a tablet PC, a laptop computer, a personal digital assistant (PDA), a portable multimedia player (PMP), a digital camera, a music player, a portable game console, navigation, or the like. The mobile device 200 may also be any wearable device such as a smart watch, a smart belt, or a smart band, etc.

Referring to FIGS. 4 and 5, the mobile device 200 performs a wireless charging function, and a wireless communication function such as a near field communication (NFC) function. For example, the mobile device 200 may include an NFC system 210 and a wireless charging system 220, and the mobile device 200 may further include a battery 230 for providing a source power voltage VBAT to various functional blocks in the mobile device 200 and a power management integrated circuit (PMIC) 240 for performing power management for the source power voltage VBAT from the battery 230 and generating a power supply voltage used in a system in the mobile device 200. Although FIG. 4 shows an example in which the NFC system 210 directly receives the source power voltage VBAT from the battery 230, exemplary embodiments of the inventive concept are not limited thereto and the NFC system 210 may receive the source power voltage VBAT via the PMIC 240. In FIG. 4, detailed configurations of the NFC system 210 and the wireless charging system 220 are omitted. However, one or more IPs for the NFC function may be provided in the NFC system 210, and one or more IPs for the wireless charging function may be provided in the wireless charging system 220.

As the performance of the mobile device 200 evolves and various functions are embedded, whereas the size of the mobile device 200 decreases, the likelihood of interference between systems in the mobile device 200 increases. As an example, interference may occur between a wireless communication coil 213 in the NFC system 210 and a wireless charging coil 223 in the wireless charging system 220. In particular, as shown in FIG. 5, the wireless communication coil 213 and the wireless charging coil 223 may overlap each other. For example, such overlap may occur due to layout constraints in the mobile device 200. In this case, interference between the two coils may frequently occur.

As an example, when wireless power transmission/reception is performed between a system outside the mobile device 200 and the wireless charging system 220 of the mobile device 200, high electromagnetic wave energy may be delivered to the wireless charging coil 223 of the wireless charging system 220 and some of the electromagnetic wave energy may be induced in the NFC system 210 through the wireless communication coil 213. In this case, a reverse voltage situation may occur due to the electromagnetic wave energy induced in the NFC system 210, and other components (e.g., the battery 230 or the PMIC 240) of the mobile device 200 may be damaged when a reverse current is delivered to the outside of the NFC system 210.

Referring to FIGS. 4 and 5, the NFC system 210 may include a regulator 211 for receiving the source power voltage VBAT from the battery 230 and processing the source power voltage VBAT to generate a regulating voltage VREG, and a power amplifier (TX PA) 212 for amplifying the power of the regulating voltage VREG. In addition, a reverse voltage-monitoring circuit 214 as described in the above exemplary embodiments may be connected to the input terminal and the output terminal of the regulator 211. The reverse voltage-monitoring circuit 214 may also receive the source power voltage VBAT and the regulating voltage VREG as input signals, and may receive the regulating voltage VREG as a driving power voltage.

The semiconductor devices in the above-described exemplary embodiments may include various components. For example, the NFC system 210 may include a semiconductor device according to an exemplary embodiment of the inventive concept. The semiconductor device may be defined as including the regulator 211, the power amplifier 212, and the reverse voltage-monitoring circuit 214, which correspond to IPs. In this case, the semiconductor device may correspond to an NFC module, and the NFC module may be connected to the wireless communication coil 213 through one or more terminals, and a voltage caused by mutual induction on the wireless communication coil 213 may be transmitted to the NFC module. Alternatively, based on the control of the NFC module, the wireless communication coils 213 may provide a voltage according to mutual induction to an external device.

Alternatively, according to a modified exemplary embodiment, the semiconductor device may be defined as including the wireless communication coil 213 as well as an NFC module, which includes the regulator 211, the power amplifier 212, and the reverse voltage-monitoring circuit 214.

As in the above-described exemplary embodiments, the regulating voltage VREG provided as the driving power voltage of the reverse voltage-monitoring circuit 214 may have a very small level when the mobile device 200 enters a power down mode, and thus, power consumption may be greatly reduced and may be close to zero while no reverse voltage situation occurs. In addition, when a reverse voltage situation occurs, a regulating voltage VREG of which the level is raised corresponding thereto may be provided as a driving power voltage to the reverse voltage-monitoring circuit 214, and thus, the reverse voltage-monitoring circuit 214 may monitor a reverse voltage situation with sufficient driving capability and output a control signal according to a monitoring result.

Although an example in which the reverse voltage-monitoring circuit 214 is connected to the input terminal and the output terminal of the regulator 211 is shown in FIGS. 4 and 5, the inventive concept is not limited thereto. For example, a reverse current caused by the wireless communication coil 213 of the NFC system 210 may be introduced into the battery 230 through the power amplifier 212 and the regulator 211, and reverse current blocking by reverse voltage monitoring may be implemented. According to an exemplary embodiment, the reverse voltage-monitoring circuit 214 may be connected to the input terminal and the output terminal of the power amplifier 212 and perform reverse voltage monitoring by comparing the voltage level of the input terminal of the power amplifier 212 with the voltage level of the output terminal of the power amplifier 212. In this case, a reverse current may be prevented from being transmitted from the power amplifier 212 to the regulator 211.

Although an example in which the a reverse voltage-monitoring circuit according to an exemplary embodiment of the inventive concept is applied to the NFC system 210 is shown in FIGS. 4 and 5, the inventive concept is not limited thereto. For example, a reverse voltage-monitoring circuit according to an exemplary embodiment of the inventive concept may be applied to various IPs in the wireless charging system 220. The wireless charging system 220 may include a wireless charging module 221 and a wireless charging coil 223, and the wireless charging module 221 may include one or more IPs (not shown). For example, the wireless charging module 221 may include an IP that is connected to the wireless charging coil 223 and performs a matching function with a coil, or an IP that performs the control of the level of a voltage provided to the wireless charging coil 223 or provided from the wireless charging coil 223, and a reverse voltage-monitoring circuit according to an exemplary embodiment of the inventive concept may be applied to at least one IP in the wireless charging module 221.

Alternatively, a reverse voltage-monitoring circuit according to an exemplary embodiment of the inventive concept may be applied to the PMIC 240, and thus, a reverse voltage-monitoring circuit connected to the input terminal and the output terminal of the PMIC 240 may be further provided in the mobile device 200. In other words, the reverse voltage-monitoring circuit 214 may be connected to an input terminal and an output terminal of any IP for which it is advantageous to prevent a reverse voltage situation from occurring.

FIGS. 6 to 10 are circuit diagrams illustrating various examples of implementing a reverse voltage-monitoring circuit, according to various exemplary embodiments. According to various exemplary embodiments, a reverse voltage-monitoring circuit based on a voltage comparator is illustrated in FIGS. 6 to 10.

Figure 6:
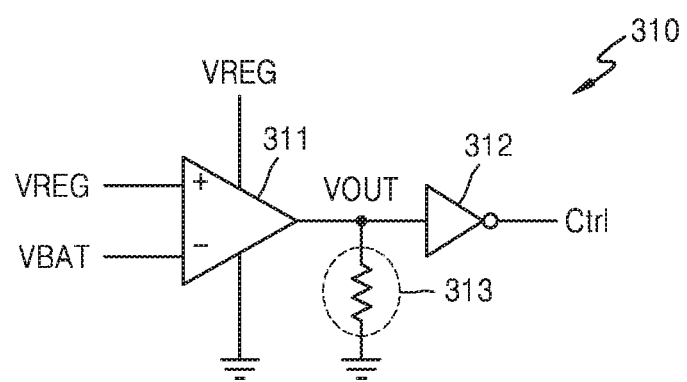
FIGS. 6 to 10 are circuit diagrams illustrating various examples of implementing a reverse voltage-monitoring circuit.

Referring to FIG. 6, a reverse voltage-monitoring circuit 310 may include a comparator 311, a logic element 312, and a passive element 313. The comparator 311 as an analog core may receive a source power voltage VBAT and a regulating voltage VREG as input signals and generate an output signal VOUT as a result of the comparison. In addition, the comparator 311 may receive a signal as a driving power voltage. As an example, the comparator 311 may receive the regulating voltage VREG as a driving power voltage.

The logic element 312 may receive the output signal VOUT from the comparator 311 and perform a logic operation on the output signal VOUT to generate a control signal Ctrl for controlling a functional block (or an IP) such as a regulator. As an example, an inverter is illustrated in FIG. 6 as the logic element 312, and the inverter may generate the control signal Ctrl having a logic level by inverting the output signal VOUT.

One terminal of the passive element 313 may be connected to the output terminal of the comparator 311. As an example, FIG. 6 illustrates a resistor as the passive element 313, and the other terminal of the passive element 313 may be connected to a ground voltage. The passive element 313 may adjust the level of the output signal VOUT. For example, the passive element 313 may pull down the level of the output signal VOUT to a ground voltage level.

In a power down mode, the comparator 311 may have a low driving capability because the comparator 311 uses a regulating voltage VREG having a very low level as the driving power voltage, and thus, the level of the output signal VOUT may float or otherwise may be unknown even when a reverse voltage situation does not occur (for example, when the level of the source power voltage VBAT is greater than the level of the regulating voltage VREG). For example, when a reverse voltage situation does not occur, the comparator 311 generates an output signal VOUT corresponding to a low level, but the level of the output signal VOUT may be unstable due to the low driving ability and thus the control signal Ctrl may be erroneously output in a state indicating that a reverse voltage situation has occurred. To prevent this situation, the passive element 313 pulls down the level of the output signal VOUT to the ground voltage level. Accordingly, a malfunction, in which the logic level of the control signal Ctrl is erroneously changed to a state indicating that a reverse voltage situation occurs, may be prevented.

Figure 7:
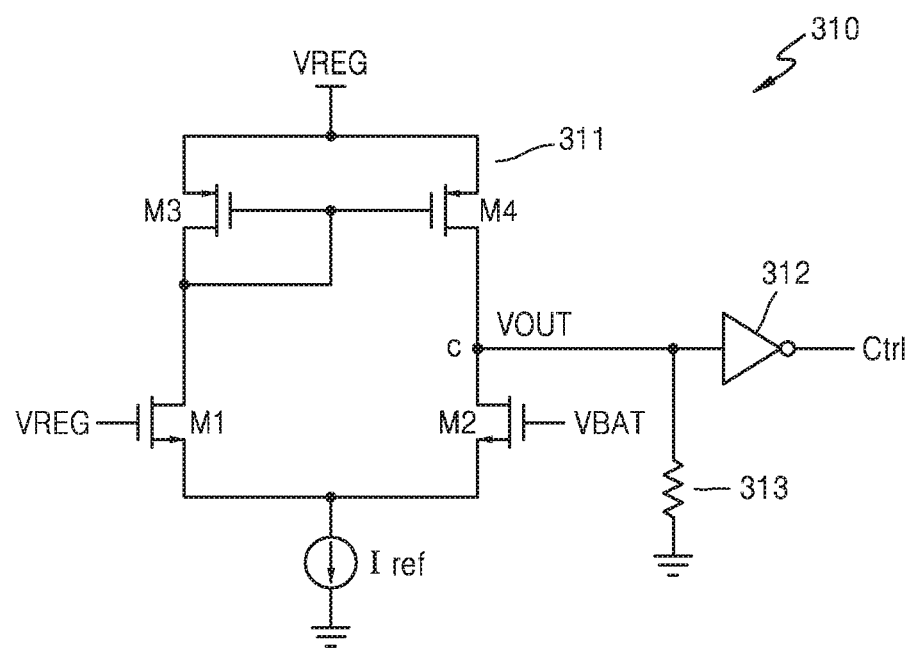

FIG. 7 shows an embodiment of the comparator 311 of FIG. 6. Referring to FIG. 7, the comparator 311 may include a plurality of MOS transistors. As an example, the comparator 311 may include a first MOS transistor M1 receiving a regulating voltage VREG through a gate and a second MOS transistor M2 receiving a source power voltage VBAT through a gate, and may receive the regulating voltage VREG as a driving power voltage. The comparator 311 may further include a third MOS transistor M3 and a fourth MOS transistor M4 connected between the driving power voltage, and the first and second MOS transistors M1 and M2, respectively. The comparator 311 may further include a current source Tref connected between the ground voltage and the first and second MOS transistors M1 and M2.

The voltage of an output node c of the comparator 311 may be developed according to a level difference between the regulating voltage VREG applied to the gate of the first MOS transistor M1 and the source power voltage VBAT applied to the gate of the second MOS transistor M2, and the output signal VOUT from the output node c may be provided to an input terminal of an inverter corresponding to the logic element 312. As described above, even if the development performance of the voltage of the output node c is lowered due to a low level driving power voltage in the power down mode, the output signal VOUT may be pulled down to the ground voltage level by the passive element 313, and thus, a control signal Ctrl indicating that a reverse voltage situation has not occurred may be generated by the logic element 312.

Figure 8:
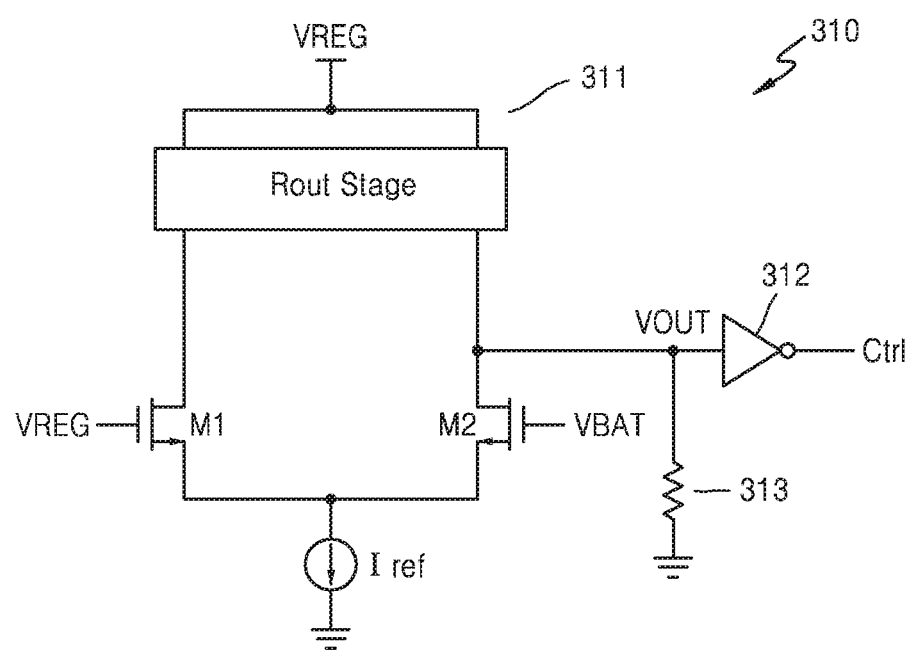
Figure 9:
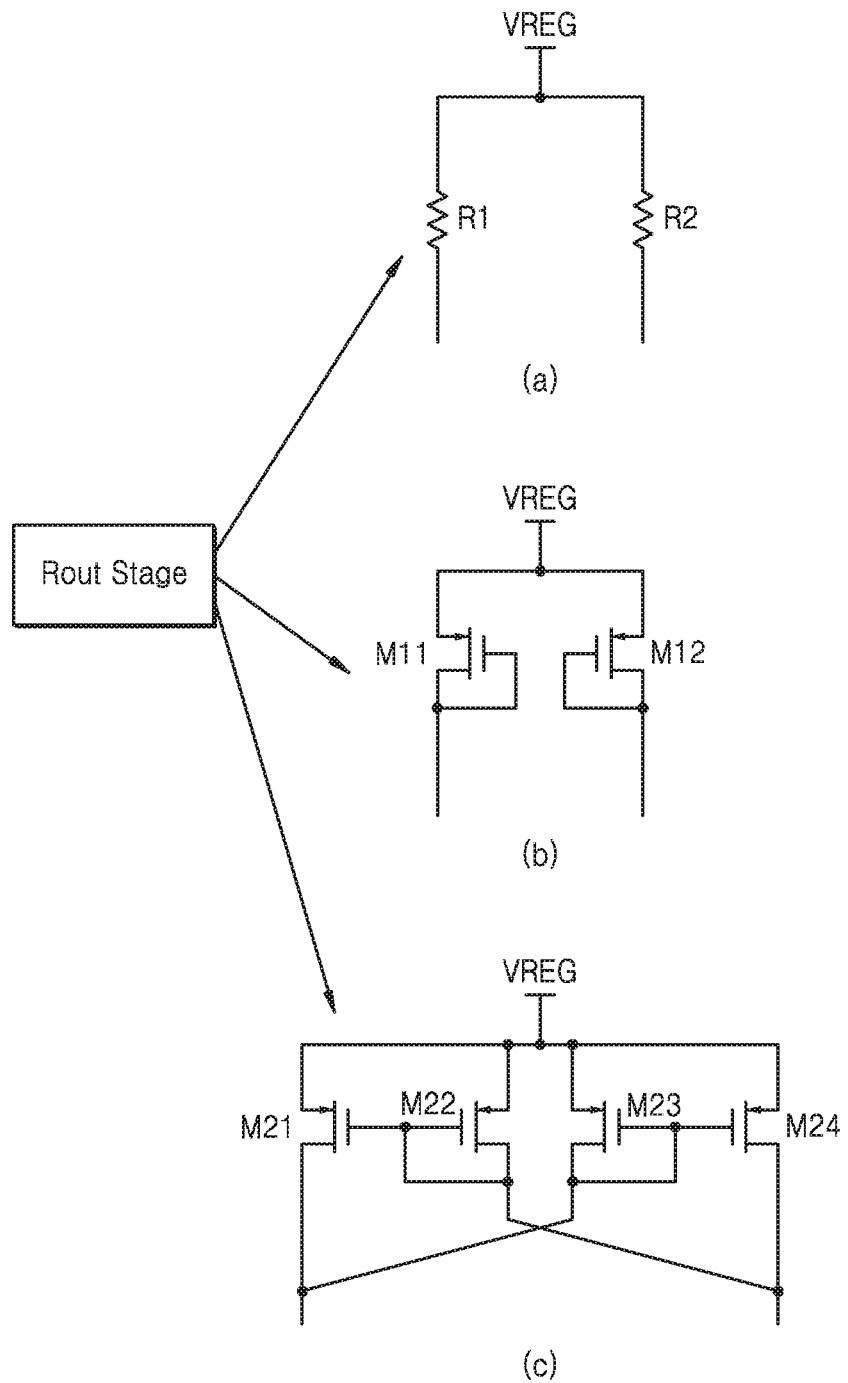
Figure 10:
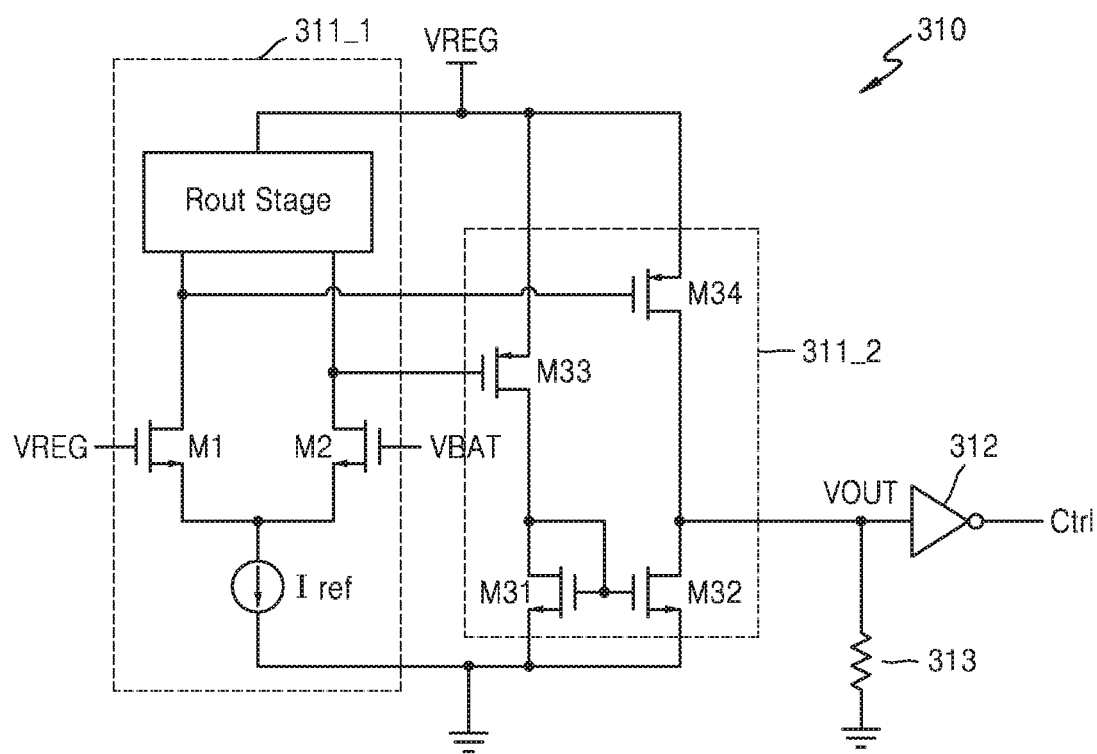

FIGS. 8 to 10 show various modifications of the comparator 311 described above, according to various exemplary embodiments.

Referring to FIG. 8, the comparator 311 may include a first MOS transistor M1 receiving a regulating voltage VREG, a second MOS transistor M2 receiving a source power voltage VBAT, and a current source Tref. In addition, a resistance stage Rout Stage may be arranged in place of the third and fourth MOS transistors M3 and M4 in the above-described embodiment at positions where the third and fourth MOS transistors M3 and M4 are disposed. The resistance stage Rout Stage may include various circuits for improving the comparative performance of the comparator 311.

Referring to (a) of FIG. 9, the resistance stage Rout Stage may include one or more resistance elements R1 and R2. When the resistance stage Rout Stage shown in (a) of FIG. 9 is applied to the comparator 311 of FIG. 8, a first resistance element R1 may be connected between the regulating voltage VREG as a driving power voltage and one electrode of the first MOS transistor M1, and the second resistance element R2 may be connected between the regulating voltage VREG and one electrode of the second MOS transistor M2.

Referring to (b) of FIG. 9, the resistance stage Rout Stage alternatively may include one or more MOS transistors M11 and M12. When the resistance stage Rout Stage shown in (b) of FIG. 9 is applied to the comparator 311 of FIG. 8, the MOS transistor M11 of the resistance stage Rout Stage may be connected to the regulating voltage VREG as a driving power voltage and one electrode of the first MOS transistor M1, and the gate and drain electrodes of the MOS transistor M11 may be connected to each other. The MOS transistor M12 of the resistance stage may be connected between the regulating voltage VREG and one electrode of the second MOS transistor M2, and the gate and drain electrodes of the MOS transistor M12 may be connected to each other.

Referring to (c) of FIG. 9, the resistance stage Rout Stage alternatively may include one or more MOS transistors M21 to M24. As an example, the MOS transistors M21 to M24 may be implemented as two pairs of mirrors, and the gates of a pair of MOS transistors M21 and M22 of the resistance stage may be electrically connected to each other, and the gates of the other pair of MOS transistors M23 and M24 of the resistance stage may be electrically connected to each other.

The comparator 311 shown in FIG. 10 is a comparator in which a comparison function is performed by two stages. Referring to FIG. 10, a first stage 311_1 of the comparator 311 may include a first MOS transistor M1 receiving a regulating voltage VREG, a second MOS transistor M2 receiving a source power voltage VBAT, a current source Tref, and a resistance stage Rout Stage, similar to the configuration shown in FIG. 8. The outputs of the first stage 311_1 may be provided as inputs of a second stage 311_2 of the comparator 311. The second stage 311_2 of the comparator 311 may include MOS transistors M33 and M34 receiving the outputs of the first stage through gates thereof and MOS transistors M31 and M32 connected between the MOS transistors M33 and M34 and a ground voltage. The comparison performance of the comparator 311 shown in FIG. 10 may be improved by performing a comparison operation by the two stages.

FIGS. 11A and 11B are tables showing an operation example when a power supply voltage VDD is applied as a driving power voltage to a reverse voltage-monitoring circuit as in the related art, and an operation example when a regulating voltage VREG is applied as a driving power voltage to a reverse voltage-monitoring circuit according to an exemplary embodiment, respectively.

Referring to FIG. 11A, a power supply voltage VDD having a constant level may be used as a driving voltage of a reverse voltage-monitoring circuit as in the related art. Thus, in the normal mode, a power supply voltage VDD having a relatively high level (e.g., "Level H") may be provided to the reverse voltage-monitoring circuit. Moreover, a power supply voltage VDD having a constant level regardless of a normal mode or a power down mode may be provided to the reverse voltage-monitoring circuit. This situation is indicated in FIG. 11A as the level of driving power voltage being "Level H" for the power down mode. This situation occurs when the reverse voltage-monitoring circuit is given priority and receives a power supply voltage VDD even in the power down mode, resulting in increased power usage by the reverse voltage-monitoring circuit. Moreover, a driving power voltage provided to the reverse voltage-monitoring circuit in the power down mode may be lowered such that in the power down mode, a power supply voltage VDD having a very low level (e.g., "Level L" in FIG. 11A) may be provided to the reverse voltage-monitoring circuit. This situation may occur, for example, when VDD is lowered system-wide in the power down mode. In some cases, the supply of a power supply voltage VDD to the reverse voltage-monitoring circuit may be blocked.

As shown in FIG. 11A, the reverse voltage-monitoring circuit may operate normally in the normal mode. On the other hand, in the power down mode, when a high level driving power voltage (i.e., "Level H" in FIG. 11A) is applied to the reverse voltage-monitoring circuit, the reverse voltage-monitoring circuit may operate normally, but power consumption thereof is greatly increased. On the other hand, in the power down mode, when a very low level driving power voltage (i.e., "Level L" in FIG. 11A) is applied to the reverse voltage-monitoring circuit or when the supply of a driving power voltage is blocked, the reverse voltage-monitoring circuit operates abnormally such that the reverse voltage is not prevented and damage may occur to a battery or other component as described above.

By contrast, as shown in FIG. 11B, when a regulating voltage VREG is used as a driving power voltage of a reverse voltage-monitoring circuit as in various exemplary embodiments of the inventive concept, the reverse voltage-monitoring circuit may be driven by a driving power voltage of which the level varies. FIG. 11B shows an example of the operation of the reverse voltage-monitoring circuit in a power down mode when the regulating voltage VREG is provided as the driving power voltage. As an example, when a reverse voltage situation does not occur in the power down mode, the reverse voltage-monitoring circuit may be driven by a regulating voltage VREG having a very small level (i.e., Level L) and thus power consumption thereof may be greatly reduced. In addition, by placing a passive element at the output terminal of a comparator as in the above-described exemplary embodiments, the output of the comparator may be maintained at a constant level (e.g., a ground voltage level) while a reverse voltage situation does not occur, and thus, even in the power down mode, the reverse voltage-monitoring circuit may normally perform a reverse voltage-monitoring operation. When a reverse voltage situation occurs in the power down mode, the reverse voltage-monitoring circuit may be driven by a regulating voltage VREG of which the level has been raised (i.e., Level H), thereby appropriately generating a control signal indicating the reverse voltage situation.

Figure 12:
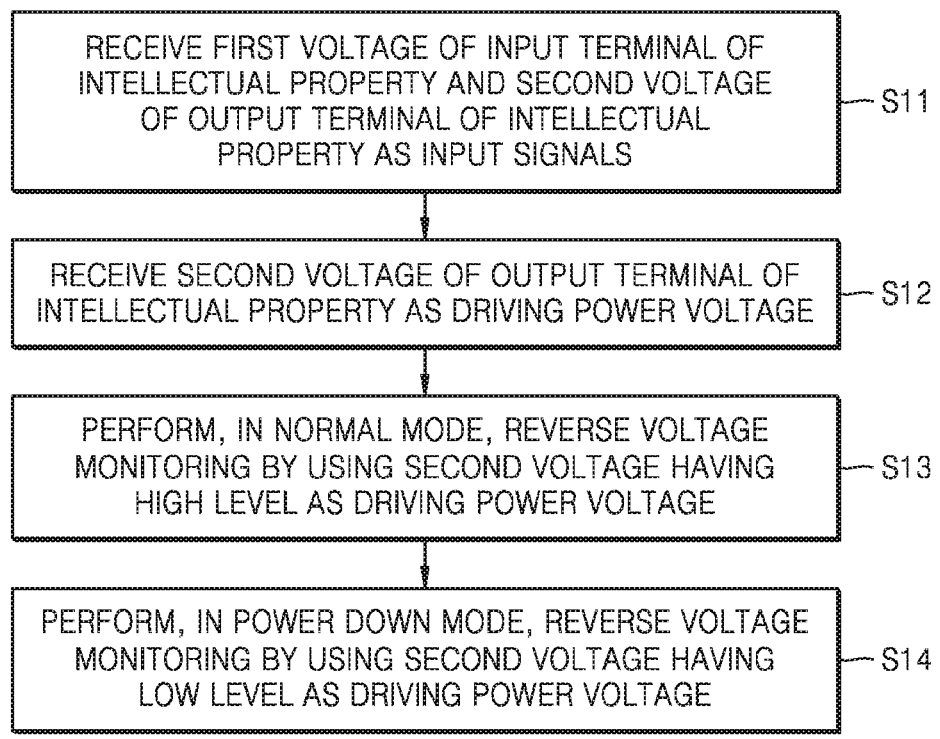
FIGS. 12 and 13 are flowcharts illustrating a method of operating a reverse voltage-monitoring circuit, according to an exemplary embodiment.
Figure 13:
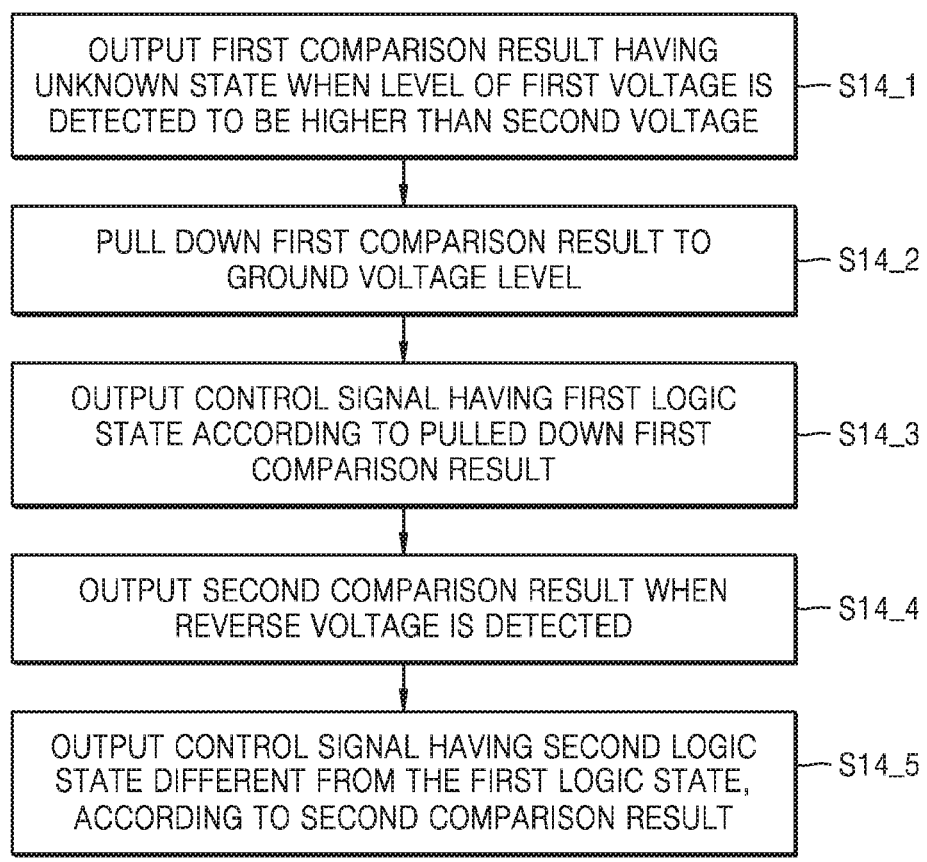

FIGS. 12 and 13 are flowcharts illustrating a method of operating a reverse voltage-monitoring circuit, according to an exemplary embodiment of the inventive concept.

Referring to FIG. 12, the reverse voltage-monitoring circuit is connected to an input terminal and an output terminal of an IP, receives a first voltage of the input terminal and a second voltage of the output terminal as input signals (Operation S11), and a comparator provided in the reverse voltage-monitoring circuit performs a comparison operation on the two received input signals. Although the IP corresponds to various kinds of circuits as in the above-described exemplary embodiments, the inventive concept is not limited to a specific kind of IP.

Also, the reverse voltage-monitoring circuit may receive the second voltage of the output terminal as a driving power voltage (Operation S12). A voltage due to a reverse voltage may be applied to the second terminal of the IP, and thus, the reverse voltage-monitoring circuit may operate based on a driving power voltage of which the level varies in a specific mode or reverse voltage situation. As an example, the second voltage of the output terminal may have a relatively large level in a normal mode, while the second voltage may have a relatively small level in a power down mode. In addition, in the power down mode, the second voltage of the output terminal may increase when a reverse voltage situation occurs, and may be maintained at a relatively small level when a reverse voltage situation does not occur.

When the reverse voltage-monitoring circuit operates in the normal mode, the reverse voltage-monitoring circuit may perform reverse voltage monitoring by using the second voltage having a relatively high level as the driving power voltage (Operation S13). On the other hand, when the reverse voltage-monitoring circuit enters the power down mode, the reverse voltage-monitoring circuit may perform reverse voltage monitoring by using the second voltage having a relatively low level as the driving power voltage (Operation S14).

FIG. 13 shows an example of a specific operation of the reverse voltage-monitoring circuit in the power down mode in connection with the operations shown in FIG. 12.

Referring to FIG. 13, the reverse voltage-monitoring circuit enters a power down mode, detects that the level of the first voltage is higher than the level of the second voltage when a reverse voltage situation does not occur, and outputs a first comparison result (Operation S14_1). The first comparison result as an output of the comparator may have an unknown state since the level of the second voltage used as the driving power voltage has a very small value close to zero. In this case, a component (e.g., a passive element) provided in the reverse voltage-monitoring circuit may pull down the first comparison result to a ground voltage level (Operation S14_2). In addition, through logic processing on the pulled down first comparison result, a control signal having a first logic state may be output from the reverse voltage-monitoring circuit (Operation S14_3).

On the other hand, when a reverse voltage situation occurs, the reverse voltage-monitoring circuit senses that the level of the second voltage is higher than the level of the first voltage, and thus, the reverse voltage-monitoring circuit may output a second comparison result (Operation S14_4).

In this case, the comparator may normally output the second comparison result since the level of the second voltage used as the driving power voltage is raised due to a reverse voltage situation. For example, the voltage level of the second comparison result may correspond to the second voltage of which the level has been raised. In addition, through logic processing on the second comparison result, a control signal having a second logic state may be output from the reverse voltage-monitoring circuit (Operation S14_5). Here, the second logic state is different from the first logic state.

Figure 14:
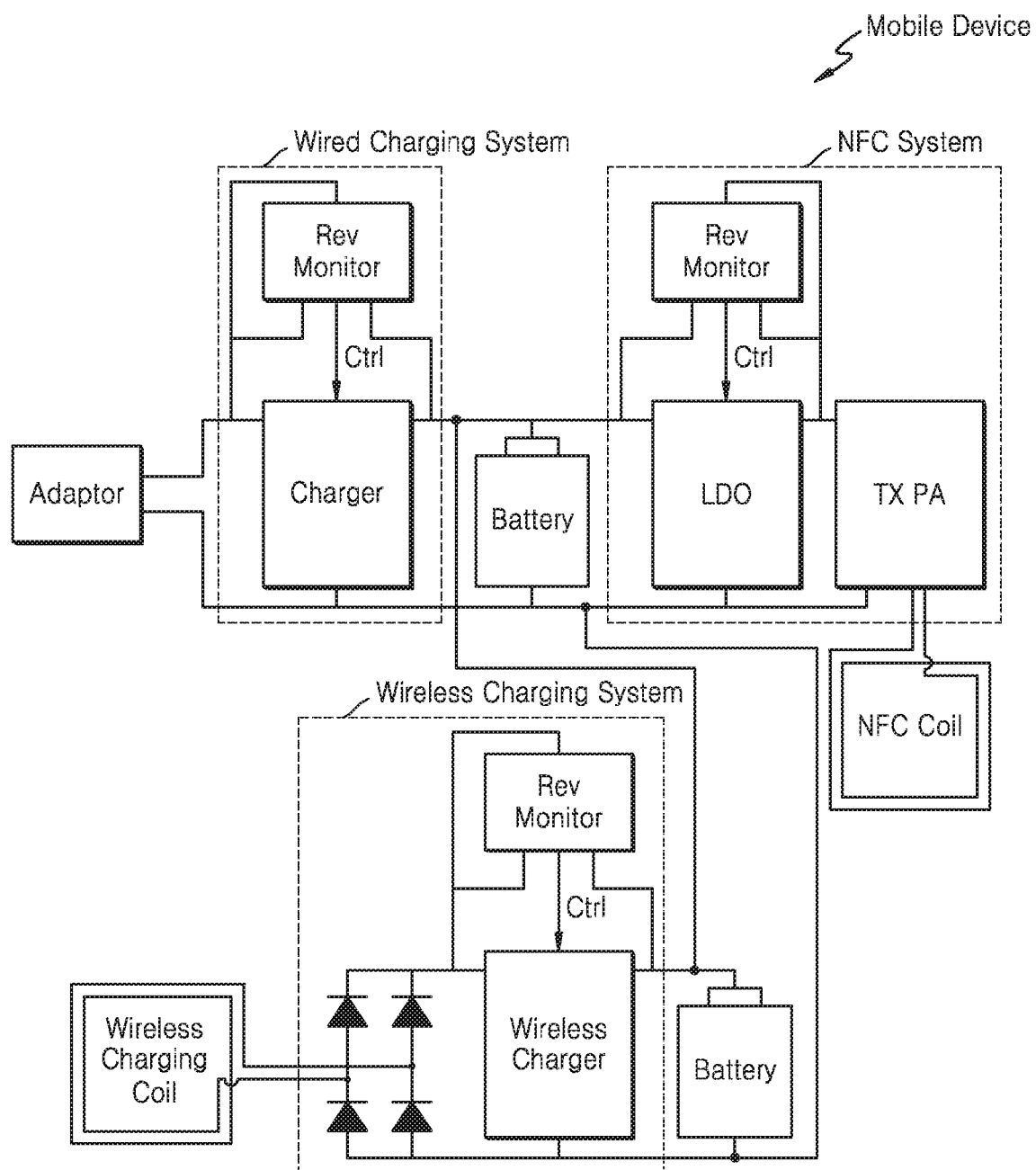
FIG. 14 is a block diagram illustrating an example in which a reverse voltage-monitoring circuit according to an exemplary embodiment is applied to various intellectual properties.

FIG. 14 is a block diagram illustrating an example in which a reverse voltage-monitoring circuit according to an exemplary embodiment of the inventive concept is applied to various IPs. FIG. 14 illustrates an example in which a mobile device includes an NFC system, a wireless charging system, and a wired charging system.

A reverse voltage-monitoring circuit according to an exemplary embodiment of the inventive concept may be applied to each of the NFC, wireless charging, and wired charging systems, and as described above, a reverse voltage may be monitored through comparison of the voltage levels of the input and output terminals of one or more IPs in each of the NFC, wireless charging, and wired charging systems. In the example of FIG. 14, a low-dropout (LDO) regulator is applied in the NFC system, and the reverse voltage-monitoring circuit receives the voltages of the input and output terminals of the LDO regulator as input signals.

The wired charging system may include a charger as an IP supporting wired charging for a battery, and the battery may be charged with power or power may be discharged from the battery depending on the function of the charger. The reverse voltage-monitoring circuit according to an exemplary embodiment of the inventive concept may receive the voltages of the input and output terminals of the charger as input signals. Similar to the above-described exemplary embodiments, the wireless charging system may include a wireless charger as an IP for charging the battery with power through a wireless charging coil, and the reverse voltage-monitoring circuit may receive the voltages of the input and output terminals of the wireless charger as input signals.

Also, the reverse voltage-monitoring circuit applied to the various systems may receive an output voltage of the system as a driving power voltage. For example, the reverse voltage-monitoring circuit may receive the voltage of the output terminal of the system as the driving power voltage.

FIGS. 15 to 19 are circuit diagrams illustrating other examples of implementing a reverse voltage-monitoring circuit, according to various exemplary embodiments. According to an exemplary embodiment, a reverse voltage-monitoring circuit based on a current comparator is illustrated in FIGS. 15 to 19.

Figure 15:
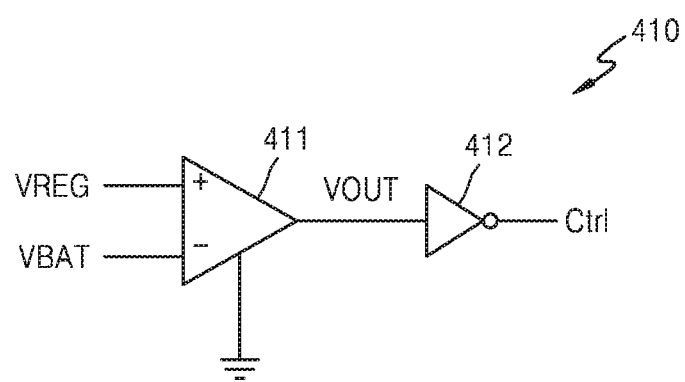
FIGS. 15 to 19 are circuit diagrams illustrating other examples of implementing a reverse voltage-monitoring circuit, according to various exemplary embodiments.
Figure 16:
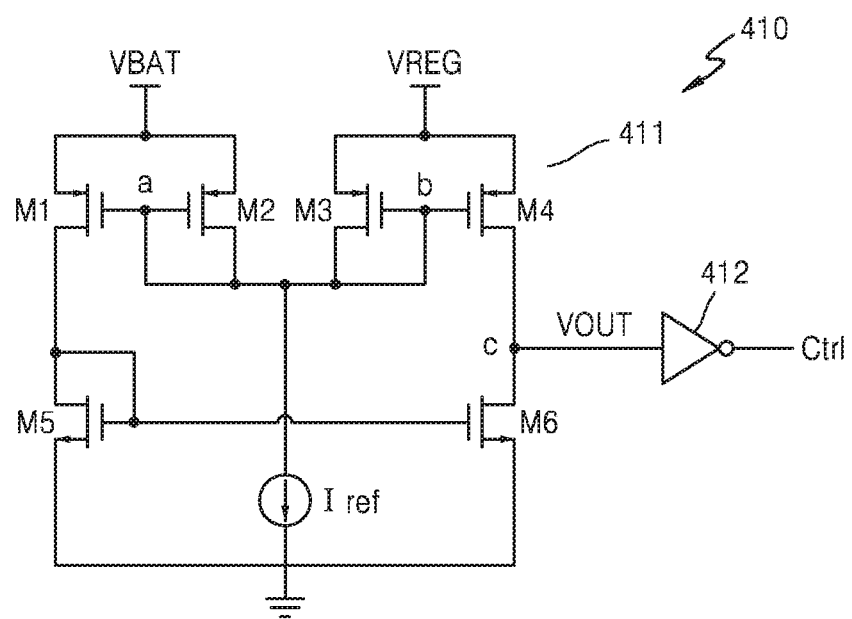

Referring to FIGS. 15 and 16, the reverse voltage-monitoring circuit 410 may include a comparator 411 and a logic element 412. The comparator 411 may receive a source power voltage VBAT and a regulating voltage VREG as input signals and generate an output signal VOUT as a result of the comparison. Also, the comparator 411 may be connected to a ground voltage.

As shown in FIG. 16, the comparator 411 may generate the output signal VOUT by comparing the level of current resulting from the source power voltage VBAT with the level of current resulting from the regulating voltage VREG. As an example, the comparator 411 may include MOS transistors M1, M2, and M5 related to the formation of a current path due to the source power voltage VBAT and MOS transistors M3, M4, and M6 related to the formation of a current path due to the regulating voltage VREG. The gates of the MOS transistors M1 and M2 may be electrically connected to each other through a first node a, and the first node a may be connected to a current source Tref. The gates of the MOS transistors M3 and M4 may be electrically connected to each other through a second node b, and the second node b may be connected to the current source Tref. The output signal VOUT output through an output node c corresponding to one electrode (e.g., a drain electrode) of the MOS transistor M6 may be provided as the input of the logic element 412, i.e., an inverter, and the output of the logic element 412 may be provided to a regulator as a control signal Ctrl.

Figure 17:
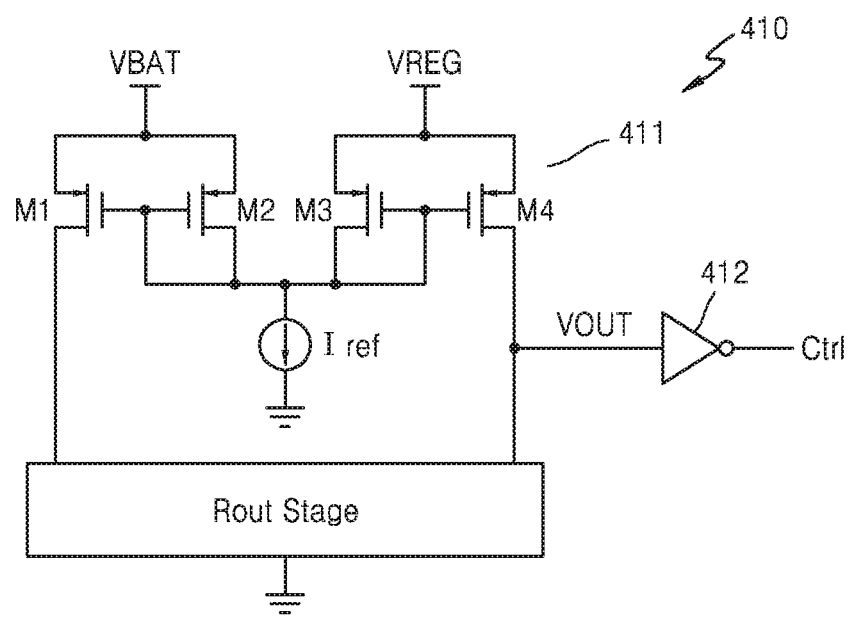

Similar to the voltage comparison method described above, the comparator 411 of a current comparison type may also be variously modified. Referring to FIG. 17, the comparator 411 may include MOS transistors M1 and M2 for receiving a source power voltage VBAT, MOS transistors M3 and M4 for receiving a regulating voltage VREG, and a current source Tref. In addition, a resistance stage Rout Stage may be arranged in place of the MOS transistors M5 and M6 in the above-described embodiment at positions where the MOS transistors M5 and M6 are disposed. The resistance stage Rout Stage may include various circuits for improving the comparative performance of the comparator 411.

Figure 18:
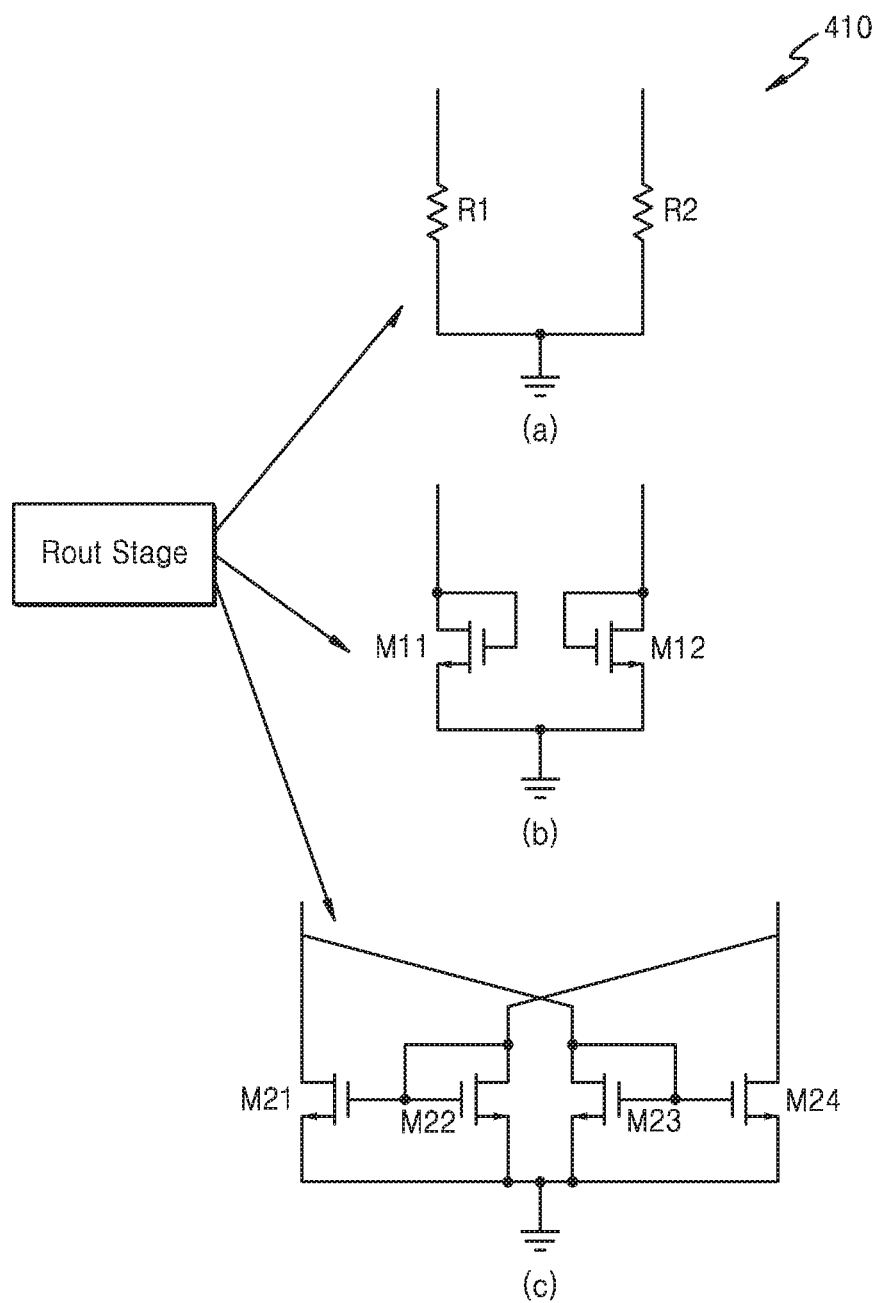

Referring to (a) of FIG. 18, the resistance stage Rout Stage may include one or more resistance elements, that is, first and second resistance elements R1 and R2. When the resistance stage Rout Stage shown in (a) of FIG. 18 is applied to the comparator 411 of FIG. 17, the first resistance element R1 may be disposed in a path through which a current due to the source power voltage VBAT flows, specifically, between one electrode of the MOS transistor M1 and the ground voltage. The second resistance element R2 may be disposed in a path through which a current due to the regulating voltage VREG flows, specifically, between one electrode of the MOS transistor M4 and the ground voltage.

Referring to (b) of FIG. 18, the resistance stage Rout Stage may include one or more MOS transistors M11 and M12. Referring to (c) of FIG. 18, the resistance stage Rout Stage may include one or more MOS transistors M21 to M24. As an example, the MOS transistors M21 to M24 may be implemented as two pairs of mirrors, and in this case, the gates of a pair of MOS transistors M21 and M22 of the resistance stage Rout Stage may be electrically connected to each other and the gates of the other pair of MOS transistors M23 and M24 of the resistance stage Rout Stage may be electrically connected to each other. Features of various circuits shown in FIG. 18 are substantially the same as those in the above-described embodiment, and thus detailed descriptions thereof will be omitted.

Figure 19:
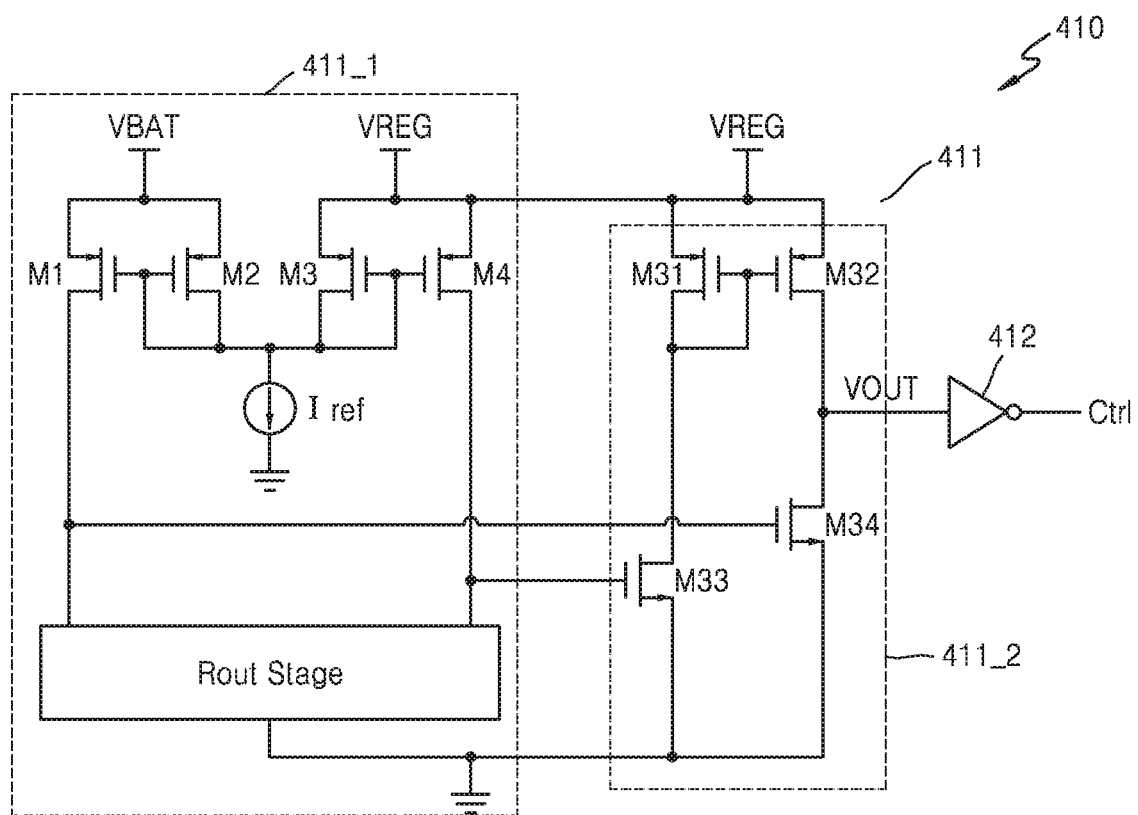

The comparator 411 shown in FIG. 19 corresponds to an example in which a comparison function is performed by the two stages as in the above-described exemplary embodiment. Referring to FIG. 19, the comparator 411 may include a first stage 411_1 and may further include a second stage 411_2 that receives a current due to the source power voltage VBAT and a current due to the regulating voltage VREG as inputs and generates an output signal VOUT through a comparison operation on the levels of the currents. The second stage 411_2 may include a plurality of MOS transistors M31 to M34.

Figure 20:
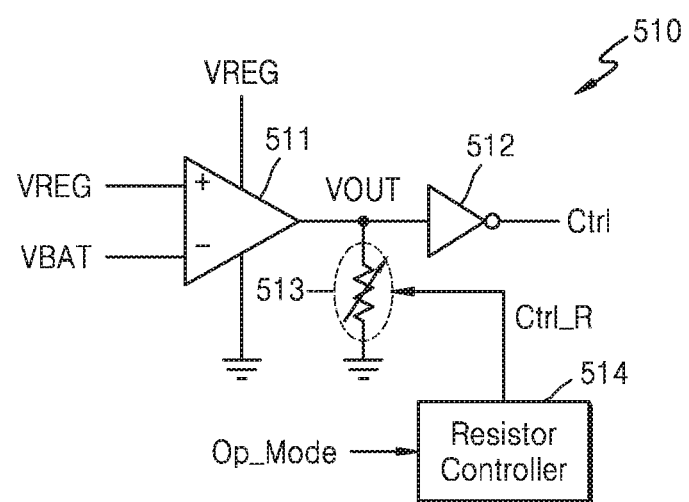
FIG. 20 is a circuit diagram of a reverse voltage-monitoring circuit according to a modified exemplary embodiment.

FIG. 20 is a circuit diagram of a reverse voltage-monitoring circuit 510 according to a modified exemplary embodiment of the inventive concept.

Referring to FIG. 20, the reverse voltage-monitoring circuit 510 may include a comparator 511, a logic element 512, and a passive element 513. According to some exemplary embodiments, the passive element 513 may include a variable resistor, and the reverse voltage-monitoring circuit 510 may further include a resistor controller 514 for controlling a resistance value of the variable resistor. According to some exemplary embodiments, the resistor controller 514 may output a resistor control signal Ctrl_R in response to an operation mode signal Op_Mode, and the resistance value of the variable resistor may be adjusted by the resistor control signal Ctrl_R.

The comparator 511 may generate a comparison result based on a voltage comparison operation as an output signal VOUT, and may receive a regulating voltage VREG and a source power voltage VBAT as input signals and perform a comparison operation. In addition, as in the above-described exemplary embodiment, the comparator 511 may receive the regulating voltage VREG as a driving power voltage. The passive element 513 including a variable resistor may pull up or pull down the output signal VOUT to a specific voltage level. For example, when the passive element 513 is connected to the ground voltage, the passive element 513 may pull down the output signal VOUT to a ground voltage level.

The resistor controller 514 may adjust a resistance value of the variable resistor according to an operation mode of the reverse voltage-monitoring circuit 510. As an example, the resistor controller 514 may adjust the resistance value of the variable resistor to be relatively small in a normal mode. On the other hand, the resistor controller 514 may adjust the resistance value of the variable resistor to be relatively large in a power down mode. That is, since the level of a driving power voltage of the reverse voltage-monitoring circuit 510 is low in the power down mode, the resistance value of the variable resistor may be adjusted to be large in order to minimize the effect of the ground voltage connected through the variable resistor on the reverse voltage-monitoring circuit 510 having low driving capability. On the other hand, in the normal mode, since the driving capability of the reverse voltage-monitoring circuit 510 is high, the resistance value of the variable resistor may be set to be relatively small.

Figure 21:
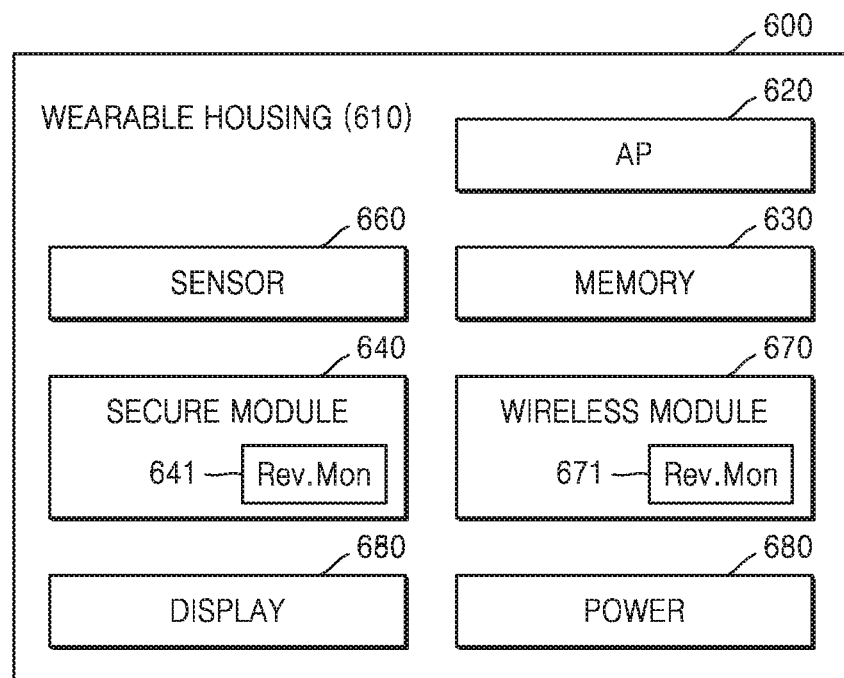
FIG. 21 is a block diagram of an Internet of Things (IoT) device including a reverse voltage-monitoring circuit according to an exemplary embodiment.

FIG. 21 is a block diagram of an Internet of Things (IoT) device 600 including a reverse voltage-monitoring circuit according to an exemplary embodiment of the inventive concept.

Referring to FIG. 21, the IOT device 600 may correspond to a wearable device attached to a part of a user's body to perform a computing operation. For example, the IoT device 600 may be a wearable device that may be worn on a user's cuff. However, the IoT device 600 according to the exemplary embodiment of the inventive concept is not limited thereto, and may be various kinds of devices that may contact or be attached to objects having desired information, such as people. As an example, it is assumed that the IoT device 600 shown in FIG. 21 is a wearable device.

The IoT device 600 may include a wearable housing 610 that may be worn on a part of a user's body. The wearable housing 610 may include a substrate having a flexible characteristic and may be implemented in a form that may be directly attached to or detached from a surface of an object having desired information or a position close to the object or is implantable in the body. The IoT device 600 implemented as the wearable device may be used in various fields such as the fitness and wellness field, the health care and medical field, the infotainment field, and the industrial and military field.

The IoT device 600 may include electronic components for continuously collecting and communicating changes in a surrounding environment including the user's body. The IoT device 600 may further include an application processor 620, a memory 630, a secure module 640, a display 650, a sensor 660, a wireless module 670, a power module 680, and the like.

The application processor 620 may be implemented as a system-on-chip and may control all operations of the IoT device 600. The application processor may be implemented as one or more microprocessors. The memory 630 may store volatile and/or non-volatile data in the IoT device 600, and the display 650 may provide a user interface. The sensor 660 may perform various sensing operations related to the function of the IoT device 600. For example, the sensor 660 may include various types of sensors, such as a temperature sensor, an acceleration sensor, a gravity sensor, which sense an external environment, and a pulse sensor related to the body. The power module 680 may provide a source power voltage to various modules included in the IoT device 600, or may provide a power supply voltage generated using a power source to the various modules.

According to an exemplary embodiment of the inventive concept, a reverse voltage-monitoring circuit may be applied to various modules in the IoT device 600. For example, FIG. 21 shows an example in which a reverse voltage-monitoring circuit (Rev. Mon) 641 and a reverse voltage-monitoring circuit (Rev. Mon) 671 are applied to the secure module 640 and the wireless module 670, respectively. Each of the secure module 640 and the wireless module 670 may perform wireless communication with an external system and cause a reverse current to flow due to various factors (e.g., mutual induction between coils, electrostatic discharge (ESD) generated by a wearer of the IoT device 600, etc.) according to the above-described examples. In this case, the reverse voltage-monitoring circuit (Rev. Mon) 641 and the reverse voltage-monitoring circuit (Rev. Mon) 671 may prevent damage to various modules, which is caused by a reverse current. In addition, a comparator (not shown) provided in the reverse voltage-monitoring circuit (Rev. Mon) 641 and the reverse voltage-monitoring circuit (Rev. Mon) 671 may use a signal (e.g., a regulating voltage), input to the comparator, as a driving power voltage, without receiving the driving power voltage from the power module 680.

While the inventive concept has been particularly shown and described with reference to various exemplary embodiments thereof, it will be understood that various changes in form and details may be made therein without departing from the spirit and scope of the following claims.

What is claimed is:

1. A semiconductor device comprising:
   a reverse voltage monitoring circuit connected to an input node and an output node of a functional block within the semiconductor device and powered by a driving power, the reverse voltage monitoring circuit configured to monitor a difference between an input level at the input node and an output level at the output node to detect a reverse voltage across the functional block; and
   a passive component connected between an output node of the reverse voltage monitoring circuit and a potential;
   wherein the driving power is provided by the output node of the functional block in the semiconductor device.

2. The semiconductor device according to claim 1, wherein the reverse voltage monitoring circuit comprises a driving power input that receives the driving power.

3. The semiconductor device according to claim 2, wherein the driving power input is connected to the output node.

4. The semiconductor device according to claim 1, wherein the functional block is a voltage regulator, a current regulator, a wired charging circuit, a wireless charging circuit, or a low dropout regulator.

5. The semiconductor device according to claim 1, wherein the reverse voltage monitoring circuit comprises a comparator.

6. The semiconductor device according to claim 5, wherein the comparator comprises a two-stage comparator.

7. The semiconductor device according to claim 1, further comprising a logic element connected to the output node.

8. The semiconductor device according to claim 1, wherein the input node receives a source power voltage.

9. The semiconductor device according to claim 2, further comprising a driving power generator that is connected to the driving power input and to the output node, that regulates a voltage on the output node according to a mode of the semiconductor device, and outputs the voltage that is regulated to the driving power input.

10. The semiconductor device according to claim 2, further comprising a driving power selector connected to the driving power input, to the output node and to an external power source,
wherein the driving power selector receives a control signal, selects one of the output node or the external power source, and connects the selected output node or the external power source to the driving power input, according to the control signal.

11. The semiconductor device according to claim 1, wherein the passive component comprises a resistor or a variable resistor.

12. The semiconductor device according to claim 11, wherein the passive component is the variable resistor, and the semiconductor device further comprises a resistor controller that receives an operation mode signal indicating an operation mode of the semiconductor device, and controls a resistance of the variable resistor according to the operation mode signal.

13. The semiconductor device according to claim 1, wherein the potential is ground or a positive voltage.

14. A semiconductor device comprising:
a regulator that regulates a source power voltage to generate a regulated voltage at an output of the regulator;
a comparator that is driven by a driving power, that performs a comparison of the source power voltage with the regulated voltage, and that generates a control signal based on the comparison; and
a passive component connected between a potential and the output of the comparator;
wherein the driving power is provided by the regulated voltage, and
the control signal controls the regulator.

15. The semiconductor device according to claim 14, wherein the potential is ground or a positive voltage.

16. The semiconductor device according to claim 14, further comprising an internal circuit electrically coupled to the output of the regulator.

17. The semiconductor device according to claim 16, wherein the internal circuit is a near field communication circuit, a wireless charging circuit, or a wired charging circuit.

18. The semiconductor device according to claim 16, wherein the internal circuit is a circuit that is powered by the regulated voltage.

19. The semiconductor device according to claim 14, wherein:
when the regulated voltage is greater than the source power voltage, the control signal controls the regulator to prevent a reverse voltage across the regulator, and
when the source power voltage is greater than or equal to the regulated voltage, the control signal controls the regulator to regulate the source power voltage.

20. A semiconductor device that operates in a normal mode and a power down mode, the semiconductor device comprising:
a regulator;
a comparator that is driven by a driving power, that performs a comparison of a source power voltage with an output of the regulator, and that generates a control signal that controls the regulator based on the comparison; and
a passive component connected between a potential and an output of the comparator,
wherein
in the normal mode, the driving power is a first voltage, and
in the power down mode, the driving power is a second voltage that is lower than the first voltage.

* * * * *